(12) United States Patent
Otsuki

(10) Patent No.: US 7,541,278 B2
(45) Date of Patent: *Jun. 2, 2009

(54) INTERCONNECT SUBSTRATE, SEMICONDUCTOR DEVICE, METHODS OF MANUFACTURING THE SAME, CIRCUIT BOARD, AND ELECTRONIC EQUIPMENT

(75) Inventor: Tetsuya Otsuki, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/219,210

(22) Filed: Jul. 17, 2008

(65) Prior Publication Data

US 2008/0293239 A1 Nov. 27, 2008

Related U.S. Application Data

(62) Division of application No. 11/279,078, filed on Apr. 7, 2006, now Pat. No. 7,413,975, which is a division of application No. 10/624,680, filed on Jul. 23, 2003, now abandoned.

(30) Foreign Application Priority Data

Jul. 23, 2002 (JP) ............................. 2002-213606

(51) Int. Cl.
*H01L 21/4763* (2006.01)
*H01L 23/495* (2006.01)

(52) U.S. Cl. ...................... 438/622; 438/123; 438/652; 257/676; 257/700; 257/E21.575; 257/E21.627; 257/E21.641

(58) Field of Classification Search ................ 438/622, 438/652, 123; 257/676, 700, E21.575, E21.627, 257/E21.641
See application file for complete search history.

(56) References Cited

U.S. PATENT DOCUMENTS

| | | | |
|---|---|---|---|
| 5,331,203 | A | 7/1994 | Wojnarowski et al. |
| 5,524,339 | A | 6/1996 | Gorowitz et al. |
| 6,017,259 | A * | 1/2000 | Motoi et al. ............... 445/51 |
| 6,137,175 | A | 10/2000 | Tabara |
| 6,274,391 | B1 | 8/2001 | Wachtler et al. |
| 6,403,463 | B1 | 6/2002 | Suyama |
| 6,458,686 | B1 | 10/2002 | Piao |
| 6,538,210 | B2 | 3/2003 | Sugaya et al. |

(Continued)

FOREIGN PATENT DOCUMENTS

JP 09-74280 3/1997

(Continued)

*Primary Examiner*—Long K Tran
(74) *Attorney, Agent, or Firm*—Oliff & Berridge, PLC

(57) ABSTRACT

A first conductive layer is formed. An insulating layer is formed so that at least a part of the insulating layer is disposed on the first conductive layer. A second conductive layer is formed so that at least a part of the second conductive layer is disposed on the insulating layer over the first conductive layer. Each of the first and second conductive layers is formed by discharging drops of a solvent containing fine particles of a conductive material. The insulating layer is formed by discharging drops of a solvent containing fine particles of an insulating material.

17 Claims, 20 Drawing Sheets

U.S. PATENT DOCUMENTS

| | | |
|---|---|---|
| 6,555,906 B2 | 4/2003 | Towle et al. |
| 6,617,193 B1 | 9/2003 | Toshio et al. |
| 6,709,898 B1 | 3/2004 | Ma et al. |
| 6,784,765 B2 | 8/2004 | Yamada et al. |
| 6,861,737 B1 | 3/2005 | Jeong et al. |
| 6,992,433 B2 | 1/2006 | Sekiya |

FOREIGN PATENT DOCUMENTS

| | | |
|---|---|---|
| JP | 11-163499 | 6/1999 |
| JP | 11-274671 | 10/1999 |
| JP | 11-345894 | 12/1999 |
| JP | A-2000-012996 | 1/2000 |
| JP | 2000-349416 | 12/2000 |
| JP | A-2001-127207 | 5/2001 |
| JP | A-2001-274324 | 10/2001 |
| JP | 2002-111218 | 4/2002 |
| JP | 2002-198638 | 7/2002 |

\* cited by examiner

US 7,541,278 B2

INTERCONNECT SUBSTRATE, SEMICONDUCTOR DEVICE, METHODS OF MANUFACTURING THE SAME, CIRCUIT BOARD, AND ELECTRONIC EQUIPMENT

CROSS-REFERENCE

This is a Divisional of application Ser. No. 11/279,078 filed on Apr. 7, 2006, which is a divisional of application Ser. No. 10/624,680 filed on Jul. 23, 2003. The entirety of the prior applications which is incorporated herein by reference. In addition, priority is claimed from Japanese Patent Application No. 2002-213606 filed on Jul. 23, 2002, which is hereby incorporated by reference in its entirety.

BACKGROUND

The present invention relates to an interconnect substrate, a semiconductor device, methods of manufacturing the same, a circuit board, and electronic equipment.

A multilayer substrate has been used in the case where a high-density interconnect structure is necessary. For example, a multilayer substrate has been used as an interposer in a package capable of high density mounting such as ball grid array (BGA) and chip scale/size package (CSP). As a conventional method of manufacturing a multilayer substrate, there is known a method of stacking substrates having an interconnect pattern formed by etching copper foil, and electrically connecting the upper and lower interconnect patterns by forming via holes in the substrates and filling or plating the via holes with a conductive material.

According to the conventional method, since a photolithographic step must be performed for etching, a mask is necessary. The mask is expensive. Moreover, since the via holes must be formed larger for filling or plating the via holes with a conductive material, an increase in density of the interconnect structure is prevented. In the case of forming through holes by plating the via holes, since a space is formed inside the through holes, moisture removal must be taken into consideration. In the case of mechanically forming the via holes after stacking three or more substrates, the via holes cannot be formed in the substrate in the intermediate layer.

SUMMARY

A method of manufacturing an interconnect substrate according to one aspect of the present invention comprises:
  forming a first conductive layer;
  forming an insulating layer so that at least a part of the insulating layer is disposed on the first conductive layer; and
  forming a second conductive layer so that at least a part of the second conductive layer is disposed on the insulating layer over the first conductive layer,
  wherein each of the first and second conductive layers is formed by discharging drops of a solvent containing fine particles of a conductive material, and
  wherein the insulating layer is formed by discharging drops of a solvent containing fine particles of an insulating material.

A method of manufacturing a semiconductor device according to another aspect of the present invention comprises:
  manufacturing an interconnect substrate; and
  mounting a semiconductor chip on the interconnect substrate, the manufacturing of an interconnect substrate including:
  forming a first conductive layer;
  forming an insulating layer so that at least a part of the insulating layer is disposed on the first conductive layer; and
  forming a second conductive layer so that at least a part of the second conductive layer is disposed on the insulating layer over the first conductive layer,
  wherein each of the first and second conductive layers is formed by discharging drops of a solvent containing fine particles of a conductive material, and
  wherein the insulating layer is formed by discharging drops of a solvent containing fine particles of an insulating material.

A method of manufacturing a semiconductor device according to a further aspect of the present invention comprises:
  mounting a semiconductor chip over a substrate with a surface of the semiconductor chip on which an electrode is formed facing upward;
  forming a first conductive layer over the substrate and the semiconductor chip so that the first conductive layer is electrically connected with the electrode of the semiconductor chip;
  forming an insulating layer so that at least a part of the insulating layer is disposed on the first conductive layer; and
  forming a second conductive layer so that at least a part of the second conductive layer is disposed on the insulating layer over the first conductive layer,
  wherein each of the first and second conductive layers is formed by discharging drops of a solvent containing fine particles of a conductive material, and
  wherein the insulating layer is formed by discharging drops of a solvent containing fine particles of an insulating material.

A method of manufacturing a semiconductor device according to still another aspect of the present invention comprises:
  mounting a semiconductor chip over a first substrate with a surface of the semiconductor chip on which an electrode is formed facing upward;
  attaching a second substrate to the first substrate, the second substrate having a shape which avoids the semiconductor chip;
  forming a first conductive layer over the second substrate and the semiconductor chip so that the first conductive layer is electrically connected with the electrode of the semiconductor chip;
  forming an insulating layer so that at least a part of the insulating layer is disposed on the first conductive layer; and
  forming a second conductive layer so that at least a part of the second conductive layer is disposed on the insulating layer over the first conductive layer,
  wherein each of the first and second conductive layers is formed by discharging drops of a solvent containing fine particles of a conductive material, and
  wherein the insulating layer is formed by discharging drops of a solvent containing fine particles of an insulating material.

A method of manufacturing a semiconductor device according to a still further aspect of the present invention comprises:
  forming a first conductive layer over a semiconductor wafer on which a plurality of integrated circuits are formed so that the first conductive layer is electrically connected with electrodes of the semiconductor wafer;

forming an insulating layer so that at least a part of the insulating layer is disposed on the first conductive layer;

forming a second conductive layer so that at least a part of the second conductive layer is disposed on the insulating layer over the first conductive layer; and cutting the semiconductor wafer, wherein each of the first and second conductive layers is formed by discharging drops of a solvent containing fine particles of a conductive material, and wherein the insulating layer is formed by discharging drops of a solvent containing fine particles of an insulating material.

An interconnect substrate according to yet another aspect of the present invention is manufactured by any of the above methods.

A semiconductor device according to a yet further aspect of the present invention is manufactured by any the above methods.

A semiconductor device according to a yet further aspect of the present invention comprises:

a substrate including a depression section;

a first conductive layer formed to pass through the depression section;

an insulating layer, at least a part of the insulating layer being disposed on the first conductive layer;

a second conductive layer, at least a part of the second conductive layer being disposed on the insulating layer over the first conductive layer; and a semiconductor chip mounted in the depression section.

A semiconductor device according to a yet further aspect of the present invention comprises:

a substrate including a depression section;

a semiconductor chip mounted in the depression section of the substrate with a surface of the semiconductor chip on which an electrode is formed facing upward;

a first conductive layer formed over the substrate and the semiconductor chip so that the first conductive layer is electrically connected with the electrode of the semiconductor chip;

an insulating layer, at least a part of the insulating layer being disposed on the first conductive layer; and a second conductive layer, at least a part of the second conductive layer being disposed on the insulating layer over the first conductive layer.

A semiconductor device according to a yet further aspect of the present invention comprises:

a first substrate;

a semiconductor chip mounted over the first substrate with a surface of the semiconductor chip on which an electrode is formed facing upward;

a second substrate having a shape which avoids the semiconductor chip and being attached to the first substrate;

a first conductive layer which is formed over the second substrate and the semiconductor chip so that the first conductive layer is electrically connected with the electrode of the semiconductor chip;

an insulating layer, at least a part of the insulating layer being disposed on the first conductive layer; and a second conductive layer, at least a part of the second conductive layer being disposed on the insulating layer over the first conductive layer.

A circuit board according to a yet further aspect of the present invention is equipped with any of the above semiconductor devices.

Electronic equipment according to a yet further aspect of the present invention comprises any of the above semiconductor devices.

DETAILED DESCRIPTION OF EMBODIMENTS

Figure 1:
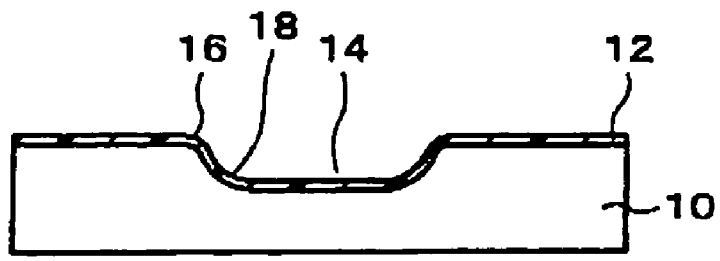
FIG. 1 is a view illustrating a method of manufacturing an interconnect substrate according to a first embodiment to which the present invention is applied.

An objective of embodiments of the present invention is to achieve reduction of cost, an increase in density of an interconnect structure, an increase in reliability, and an increase in the degrees of freedom of manufacture for an interconnect substrate, a semiconductor device, methods of manufacturing the same, a circuit board, and electronic equipment.

(1) A method of manufacturing an interconnect substrate according to one embodiment of the present invention comprises:

forming a first conductive layer;

forming an insulating layer so that at least a part of the insulating layer is disposed on the first conductive layer; and forming a second conductive layer so that at least a part of the second conductive layer is disposed on the insulating layer over the first conductive layer, wherein each of the first and second conductive layers is formed by discharging drops of a solvent containing fine particles of a conductive material, and wherein the insulating layer is formed by discharging drops of a solvent containing fine particles of an insulating material.

According to this method of manufacturing an interconnect substrate, since the first and second conductive layers and the insulating layer are formed by discharging drops, an increase in density of the interconnect structure can be achieved at low cost, whereby reliability and the degrees of freedom of manufacture can be increased.

(2) In this method of manufacturing an interconnect substrate, the second conductive layer may be formed so that a part of the second conductive layer is electrically connected with a part of the first conductive layer.

(3) In this method of manufacturing an interconnect substrate, the insulating layer may be formed on the first conductive layer and in a region adjacent to the first conductive layer.

(4) In this method of manufacturing an interconnect substrate, the insulating layer may be formed of a plurality of layers, a lower layer of the insulating layer may be formed in a region adjacent to a region in which the first conductive layer is formed, and an upper layer of the insulating layer may be formed on the first conductive layer and the lower layer of the insulating layer.

(5) In this method of manufacturing an interconnect substrate, the lower layer of the insulating layer may be formed after forming the first conductive layer.

(6) In this method of manufacturing an interconnect substrate, the first conductive layer may be formed after forming the lower layer of the insulating layer.

(7) This method of manufacturing an interconnect substrate may further comprise forming one or more posts on the first conductive layer by discharging drops of a solvent containing fine particles of a conductive material, wherein the insulating layer may be formed to avoid a region in which the posts are formed.

(8) In this method of manufacturing an interconnect substrate, the insulating layer may be formed so that a height of an upper surface of the insulating layer is substantially equal to a height of an upper surface of at least one of the posts.

(9) In this method of manufacturing an interconnect substrate, the second conductive layer may be formed to pass over at least one of the posts.

(10) In this method of manufacturing an interconnect substrate, the second conductive layer may be formed to avoid at least one of the posts.

(11) This method of manufacturing an interconnect substrate may further comprise:

forming a second insulating layer so that at least a part of the second insulating layer is disposed on the second conductive layer; and forming a third conductive layer so that at least a part of the third conductive layer is disposed on the second insulating layer over the second conductive layer;

wherein the third conductive layer may be formed by discharging drops of a solvent containing fine particles of a conductive material; and wherein the second insulating layer may be formed by discharging drops of a solvent containing fine particles of an insulating material.

(12) In this method of manufacturing an interconnect substrate, the second insulating layer may be formed to avoid a region in which at least one of the posts is formed, and the third conductive layer may be formed to pass over at least one of the posts.

(13) In this method of manufacturing an interconnect substrate, at least one of the posts may be formed by a plurality of steps.

(14) This method of manufacturing an interconnect substrate may further comprise forming one or more electronic components, wherein each of a plurality of components forming one of the electronic components may be formed by discharging drops of a solvent containing fine particles of a material.

(15) In this method of manufacturing an interconnect substrate, each of the electronic components may be one of a capacitor, a resistor, a diode, and a transistor.

(16) In this method of manufacturing an interconnect substrate, at least one of the electronic components may be formed on a surface on which the first conductive layer is formed.

(17) In this method of manufacturing an interconnect substrate, at least one of the electronic components may be formed on the insulating layer.

(18) In this method of manufacturing an interconnect substrate, at least one of the electronic components may be formed on the second insulating layer.

(19) In this method of manufacturing an interconnect substrate, the first conductive layer may be formed on a substrate.

(20) In this method of manufacturing an interconnect substrate,
the substrate may include a depression section, and
the first conductive layer may be formed to pass through the depression section.

(21) In this method of manufacturing an interconnect substrate, at least a top surface of the substrate may be formed of an insulating material.

(22) In this method of manufacturing an interconnect substrate,
the substrate may include an insulating section and a conductive section which is formed through the insulating section, and
the first conductive layer may be formed over the insulating section and the conductive section so that the first conductive layer is electrically connected with the conductive section.

(23) This method of manufacturing an interconnect substrate may further comprise removing the substrate from the first conductive layer.

(24) A method of manufacturing a semiconductor device according to another embodiment of the present invention comprises:
manufacturing an interconnect substrate; and
mounting a semiconductor chip on the interconnect substrate,
the manufacturing of an interconnect substrate including:
forming a first conductive layer;
forming an insulating layer so that at least a part of the insulating layer is disposed on the first conductive layer; and
forming a second conductive layer so that at least a part of the second conductive layer is disposed on the insulating layer over the first conductive layer,
wherein each of the first and second conductive layers is formed by discharging drops of a solvent containing fine particles of a conductive material, and
wherein the insulating layer is formed by discharging drops of a solvent containing fine particles of an insulating material.

According to this method of manufacturing a semiconductor device, since the first and second conductive layers and the insulating layer are formed by discharging drops, an increase in density of the interconnect structure can be achieved at low cost, whereby reliability and the degrees of freedom of manufacture can be increased.

(25) In this method of manufacturing a semiconductor device,
the interconnect substrate may be manufactured with a part of the first conductive layer being exposed, and
the exposed part of the first conductive layer may be electrically connected with the semiconductor chip.

(26) In this method of manufacturing a semiconductor device, a conductive layer other than the first and second conductive layers may be electrically connected with the semiconductor chip.

(27) In this method of manufacturing a semiconductor device, the first conductive layer may be formed over a substrate.

(28) In this method of manufacturing a semiconductor device,
the substrate may include a depression section,
the first conductive layer may be formed to pass through the depression section, and
the semiconductor chip may be mounted in the depression section.

(29) In this method of manufacturing a semiconductor device,
the substrate may include an insulating section and a conductive section which is formed through the insulating section, and
the first conductive layer may be formed over the insulating section and the conductive section so that the first conductive layer is electrically connected with the conductive section.

(30) This method of manufacturing a semiconductor device may further comprise removing the substrate from the first conductive layer.

(31) A method of manufacturing a semiconductor device according to a further embodiment of the present invention comprises:
mounting a semiconductor chip over a substrate with a surface of the semiconductor chip on which an electrode is formed facing upward;
forming a first conductive layer over the substrate and the semiconductor chip so that the first conductive layer is electrically connected with the electrode of the semiconductor chip;
forming an insulating layer so that at least a part of the insulating layer is disposed on the first conductive layer; and
forming a second conductive layer so that at least a part of the second conductive layer is disposed on the insulating layer over the first conductive layer,
wherein each of the first and second conductive layers is formed by discharging drops of a solvent containing fine particles of a conductive material, and
wherein the insulating layer is formed by discharging drops of a solvent containing fine particles of an insulating material.

According to this method of manufacturing a semiconductor device, since the first and second conductive layers and the insulating layer are formed by discharging drops, an increase in density of the interconnect structure can be achieved at low cost, whereby reliability and the degrees of freedom of manufacture can be increased.

(32) In this method of manufacturing a semiconductor device,
the substrate may include a depression section, and
the semiconductor chip may be mounted in the depression section.

(33) This method of manufacturing a semiconductor device may further comprise forming a resin layer by filling the depression section in which the semiconductor chip is mounted with a resin,
wherein the first conductive layer may be formed to pass over the resin layer.

(34) A method of manufacturing a semiconductor device according to still another embodiment of the present invention comprises:

mounting a semiconductor chip over a first substrate with a surface of the semiconductor chip on which an electrode is formed facing upward;

attaching a second substrate to the first substrate, the second substrate having a shape which avoids the semiconductor chip;

forming a first conductive layer over the second substrate and the semiconductor chip so that the first conductive layer is electrically connected with the electrode of the semiconductor chip;

forming an insulating layer so that at least a part of the insulating layer is disposed on the first conductive layer; and forming a second conductive layer so that at least a part of the second conductive layer is disposed on the insulating layer over the first conductive layer, wherein each of the first and second conductive layers is formed by discharging drops of a solvent containing fine particles of a conductive material, and wherein the insulating layer is formed by discharging drops of a solvent containing fine particles of an insulating material.

According to this method of manufacturing a semiconductor device, since the first and second conductive layers and the insulating layer are formed by discharging drops, an increase in density of the interconnect structure can be achieved at low cost, whereby reliability and the degrees of freedom of manufacture can be increased.

(35) In this method of manufacturing a semiconductor device, the second substrate may have a coefficient of thermal expansion closer to a coefficient of thermal expansion of the semiconductor chip than a coefficient of thermal expansion of the first substrate.

(36) A method of manufacturing a semiconductor device according to a still further embodiment of the present invention comprises:

forming a first conductive layer over a semiconductor wafer on which a plurality of integrated circuits are formed so that the first conductive layer is electrically connected with electrodes of the semiconductor wafer;

forming an insulating layer so that at least a part of the insulating layer is disposed on the first conductive layer;

forming a second conductive layer so that at least a part of the second conductive layer is disposed on the insulating layer over the first conductive layer; and cutting the semiconductor wafer, wherein each of the first and second conductive layers is formed by discharging drops of a solvent containing fine particles of a conductive material, and wherein the insulating layer is formed by discharging drops of a solvent containing fine particles of an insulating material.

According to this method of manufacturing a semiconductor device, since the first and second conductive layers and the insulating layer are formed by discharging drops, an increase in density of the interconnect structure can be achieved at low cost, whereby reliability and the degrees of freedom of manufacture can be increased.

(37) In this method of manufacturing a semiconductor device, the second conductive layer may be formed so that a part of the second conductive layer is electrically connected with a part of the first conductive layer.

(38) In this method of manufacturing a semiconductor device, the insulating layer may be formed on the first conductive layer and in a region adjacent to the first conductive layer.

(39) In this method of manufacturing a semiconductor device, the insulating layer may be formed of a plurality of layers, a lower layer of the insulating layer may be formed in a region adjacent to a region in which the first conductive layer is formed, and an upper layer of the insulating layer may be formed on the first conductive layer and the lower layer of the insulating layer.

(40) In this method of manufacturing a semiconductor device, the lower layer of the insulating layer may be formed after forming the first conductive layer.

(41) In this method of manufacturing a semiconductor device, the first conductive layer may be formed after forming the lower layer of the insulating layer.

(42) This method of manufacturing a semiconductor device may further comprise forming one or more posts on the first conductive layer by discharging drops of a solvent containing fine particles of a conductive material, wherein the insulating layer may be formed to avoid a region in which the posts are formed.

(43) In this method of manufacturing a semiconductor device, the insulating layer may be formed so that a height of an upper surface of the insulating layer is substantially equal to a height of an upper surface of at least one of the posts.

(44) In this method of manufacturing a semiconductor device, the second conductive layer may be formed to pass over at least one of the posts.

(45) In this method of manufacturing a semiconductor device, the second conductive layer may be formed to avoid at least one of the posts.

(46) This method of manufacturing a semiconductor device may further comprise:

forming a second insulating layer so that at least a part of the second insulating layer is disposed on the second conductive layer; and forming a third conductive layer so that at least a part of the third conductive layer is disposed on the second insulating layer over the second conductive layer, wherein the third conductive layer may be formed by discharging drops of a solvent containing fine particles of a conductive material, and wherein the second insulating layer may be formed by discharging drops of a solvent containing fine particles of an insulating material.

(47) In this method of manufacturing a semiconductor device, the second insulating layer may be formed to avoid a region in which at least one of the posts is formed, and the third conductive layer may be formed to pass over at least one of the posts.

(48) In this method of manufacturing a semiconductor device, at least one of the posts may be formed by a plurality of steps.

(49) This method of manufacturing a semiconductor device may further comprise forming one or more electronic components, wherein each of a plurality of components forming one of the electronic components may be formed by discharging drops of a solvent containing fine particles of a material.

(50) In this method of manufacturing a semiconductor device, each of the electronic components may be one of a capacitor, a resistor, a diode, and a transistor.

(51) In this method of manufacturing a semiconductor device, at least one of the electronic components may be formed on a surface on which the first conductive layer is formed.

(52) In this method of manufacturing a semiconductor device, at least one of the electronic components may be formed on the insulating layer.

(53) In this method of manufacturing a semiconductor device, at least one of the electronic components may be formed on the second insulating layer.

(54) An interconnect substrate according to yet another embodiment of the present invention is manufactured by any of the above methods.

(55) A semiconductor device according to a yet further embodiment of the present invention is manufactured by any of the above methods.

(56) A semiconductor device according to a yet further embodiment of the present invention comprises:
a substrate including a depression section;
a first conductive layer formed to pass through the depression section;
an insulating layer, at least a part of the insulating layer being disposed on the first conductive layer;
a second conductive layer, at least a part of the second conductive layer being disposed on the insulating layer over the first conductive layer; and
a semiconductor chip mounted in the depression section.

(57) In this semiconductor device, the semiconductor chip may be electrically connected with the first conductive layer.

(58) In this semiconductor device, the semiconductor chip may be electrically connected with a conductive layer other than the first and second conductive layers.

(59) A semiconductor device according to a yet further embodiment of the present invention comprises:
a substrate including a depression section;
a semiconductor chip mounted in the depression section of the substrate with a surface of the semiconductor chip on which an electrode is formed facing upward;
a first conductive layer formed over the substrate and the semiconductor chip so that the first conductive layer is electrically connected with the electrode of the semiconductor chip;
an insulating layer, at least a part of the insulating layer being disposed on the first conductive layer; and
a second conductive layer, at least a part of the second conductive layer being disposed on the insulating layer over the first conductive layer.

(60) This semiconductor device may further comprise a resin layer formed in the depression section in which the semiconductor chip is mounted, wherein the first conductive layer may be formed to pass over the resin layer.

(61) A semiconductor device according to a yet further embodiment of the present invention comprises:
a first substrate;
a semiconductor chip mounted over the first substrate with a surface of the semiconductor chip on which an electrode is formed facing upward;
a second substrate having a shape which avoids the semiconductor chip and being attached to the first substrate;
a first conductive layer which is formed over the second substrate and the semiconductor chip so that the first conductive layer is electrically connected with the electrode of the semiconductor chip;
an insulating layer, at least a part of the insulating layer being disposed on the first conductive layer; and
a second conductive layer, at least a part of the second conductive layer being disposed on the insulating layer over the first conductive layer.

(62) In this semiconductor device, the second substrate may have a coefficient of thermal expansion closer to a coefficient of thermal expansion of the semiconductor chip than that of the first substrate.

(63) A circuit board according to a yet further embodiment of the present invention is equipped with any of the above semiconductor devices.

(64) Electronic equipment according to a yet further embodiment of the present invention comprises the any of above semiconductor devices.

The embodiments of the present invention are described below with reference to the drawings.

First Embodiment

FIGS. 1 to 10B are views illustrating a method of manufacturing an interconnect substrate according to a first embodiment of the present invention. In the present embodiment, a substrate 10 is provided as shown in FIG. 1. The shape of the substrate 10 is not limited to that of a plate (rectangular plate, for example) insofar as the substrate 10 can support a product placed or formed on the substrate 10. The substrate 10 may be formed of an insulating material (resin such as a polyimide or glass, for example), a conductor (metal such as copper, for example), or a semiconductor. The substrate 10 may be a radiator (heat sink, for example) formed of a heat radiating material such as a metal. In the case where the substrate 10 is formed of a conductor, at least the surface of the substrate 10 may be formed of an insulating film 12. The insulating film 12 may be formed by applying a resin such as a polyimide and sintering the resin at about 200-600° C. for about 1 to 5 hours.

A depression section 14 may be formed in the substrate 10. There are no specific limitations to the shapes of the opening and the bottom of the depression section 14. The shapes of the opening and the bottom of the depression section 14 may be rectangular. The inner wall surface of the depression section 14 may be inclined with respect to the upper side (surface surrounding the depression section 14) of the substrate 10 or the bottom of the depression section 14. Specifically, the inner wall surface of the depression section 14 may be a tapered surface. A connection section 16 which connects the inner wall surface of the depression section 14 with the upper side (surface surrounding the depression section 14) of the substrate 10 may be a curved surface (protruding surface). A connection section 18 which connects the inner wall surface of the depression section 14 with the bottom of the depression section 14 may be a curved surface (depressed surface). If the connection sections 16 and 18 have such shapes, occurrence of breakage of a first conductive layer 20 which passes over the connection sections 16 and 18 is reduced. The depression section 14 may be formed to have a depth of about 0.5 to several millimeters by etching, cutting, or stamping. The insulating film 12 may be formed on either the entire surface of the depression section 14 (inner wall surface and bottom of the depression section 14), or formed only on a part of the depression section 14 (region in which the first conductive layer 20 is formed). The insulating film 12 may be formed on the entire area of the upper side of the substrate 10 (surface surrounding the depression section 14), or formed only on a part of the upper side of the substrate 10 (region in which the first conductive layer 20 is formed).

Figure 2A:
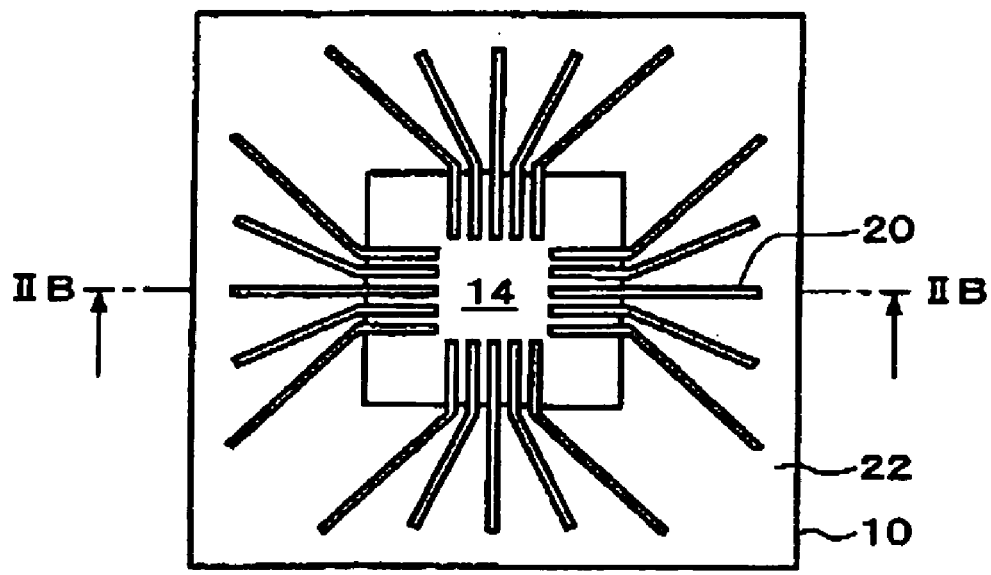
FIGS. 2A and 2B are views illustrating a method of manufacturing an interconnect substrate according to the first embodiment to which the present invention is applied.
Figure 2B:
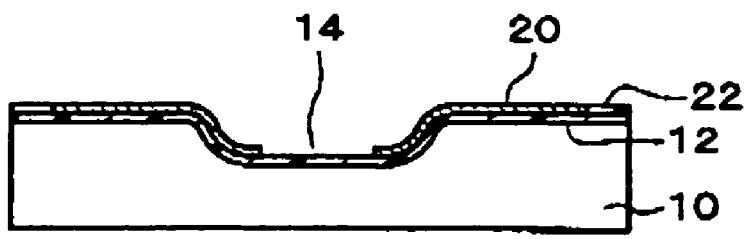

As shown in FIGS. 2A and 2B, the first conductive layer (interconnect pattern including a plurality of lines, for example) 20 is formed. The first conductive layer 20 is formed on the substrate 10. The first conductive layer 20 may be formed to pass through the depression section 14. The first conductive layer 20 is formed by discharging drops of a solvent containing fine particles of a conductive material (metal such as gold, silver, or copper, for example). An ink-jet method or a Bubble Jet (registered trademark) method may be used. As a solvent containing fine particles of gold, "Perfect Gold" (manufactured by Vacuum Metallurgical Co., Ltd.) may be used. As a solvent containing fine particles of silver, "Perfect Silver" (manufactured by Vacuum Metallurgical Co., Ltd.) may be used. There are no specific limitations to the size of the fine particles. The fine particles used herein refer to particles which can be discharged together with a solvent. The first conductive layer 20 may be formed by sintering the discharged solvent containing fine particles of a conductive material at about 200 to 600° C. for about 1 to 5 hours.

An insulating layer 26 (see FIG. 3B) is formed. The insulating layer 26 is formed by discharging drops of a solvent containing fine particles of an insulating material (resin such as a polyimide, for example). For example, an ink-jet method or a Bubble Jet (registered trademark) method may be used. The insulating layer 26 may be formed by a plurality of layers (lower layer 22 and upper layer 24, for example). In this case, a solvent containing fine particles of an insulating material may be discharged a plurality of times. The insulating layer 26 may be formed by sintering a discharged solvent containing fine particles of an insulating material at about 200 to 600° C. for about 1 to 5 hours. The sintering may be performed each time the lower layer 22 and the upper layer 24 are formed.

As shown in FIGS. 2A and 2B, the lower layer 22 may be formed in a region adjacent to a region in which the first conductive layer 20 is formed. The lower layer 22 may be formed after forming the first conductive layer 20. In this case, the lower layer 22 may be formed to avoid the upper side of the first conductive layer 20. The lower layer 22 may be formed to avoid the region in which the first conductive layer 20 is formed, and the first conductive layer 20 may be formed in the region in which the lower layer 22 is not formed. The lower layer 22 may be formed so that the upper side of the lower layer 22 has a height equal to the height of the upper side of the first conductive layer 20. The lower layer 22 may be formed so that the height of the upper side of the lower layer 22 differs from the height of the upper side of the first conductive layer 20.

Figure 3A:
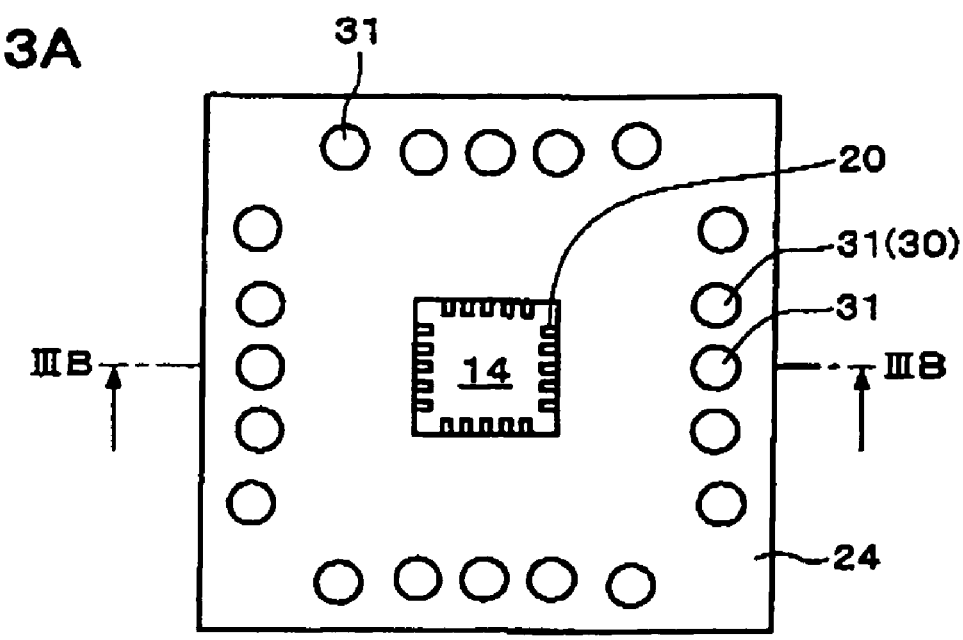
FIGS. 3A and 3B are views illustrating a method of manufacturing an interconnect substrate according to the first embodiment to which the present invention is applied.
Figure 3B:
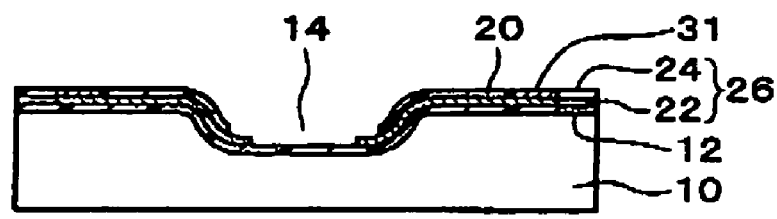

As shown in FIGS. 3A and 3B, the upper layer 24 may be formed on the first conductive layer 20 and the lower layer 22. The upper layer 24 may be formed after forming the first conductive layer 20 and the lower layer 22. The lower layer 22 may be formed first, and a part of the upper layer 24 may be formed on the lower layer 22 so as to avoid the first conductive layer 20. Then, the first conductive layer 20 may be formed, and the remaining portion of the upper layer 24 may be formed on the first conductive layer 20.

The insulating layer 26 is formed in this manner so that at least a part (upper layer 24, for example) of the insulating layer 26 is disposed on the first conductive layer 20. The insulating layer 26 may be formed to avoid a part of the first conductive layer 20. The insulating layer 26 may be formed on the first conductive layer 20 and in the region adjacent to the first conductive layer 20. The insulating layer 26 may cover the surface of the first conductive layer 20 (surface excluding the contact area between the first conductive layer 20 and the substrate 10, an area in which a post 30 is formed, and an electrical connection section with a semiconductor chip 80 (see FIG. 11), for example). The insulating layer 26 may be formed to avoid a region in which a semiconductor chip is mounted (at least a part of the bottom of the depression section 14, for example).

The above description illustrates an example in which the insulating layer 26 is formed by a plurality of layers (a plurality of processes). However, the insulating layer 26 may be formed by a single layer (single process). For example, after forming the first conductive layer 20, the insulating layer 26 may be formed so that at least a part of the insulating layer 26 is disposed on the first conductive layer 20.

As shown in FIGS. 3A and 3B, at least one post 30 may be formed on the first conductive layer 20. The post 30 is a section which electrically connects upper and lower conductive layers. The post 30 may be larger than the first conductive layer 20 insofar as a part of the post 30 is placed on the first conductive layer 20. The post 30 is formed by discharging drops of a solvent containing fine particles of a conductive material. The insulating layer 26 is formed to avoid a region in which the post 30 is formed. The insulating layer 26 (upper layer 24, for example) may be formed so that the height of the upper surface of the insulating layer 26 is almost equal to the height of the upper side of at least one post 30.

The insulating layer 26 may be formed after forming the post 30 on the first conductive layer 20. The post 30 may be formed on the first conductive layer 20 after forming at least a part (lower layer 22, for example) of the insulating layer 26.

Examples of the post 30 formed on the first conductive layer 20 are given below. The post 30 shown in FIG. 3A consists only of a post 31 formed on the first conductive layer 20. The post 30 shown in FIG. 5 consists of the post 31 formed on the first conductive layer 20 (see FIG. 3A), a post 32 formed on the post 31 (see FIG. 4), and a post 33 formed on the post 32. The post 30 shown in FIG. 7 consists of the post 31 formed on the first conductive layer 20 (see FIG. 3A), the post 32 formed on the post 31 (see FIG. 4), the post 33 formed on the post 32 (see FIG. 5), a post 34 formed on the post 33 (see FIG. 6), and a post 35 formed on the post 34. The post 30 may be formed of a single layer or a plurality of layers. Each of the posts 31, 32, 33, 34, and 35 which makes up the post 30 may be formed by discharging drops of a solvent containing fine particles of a conductive material. The posts 31, 32, 33, 34, and 35 may be sequentially formed. Specifically, at least one post 30 may be formed by a plurality of steps.

Figure 4:
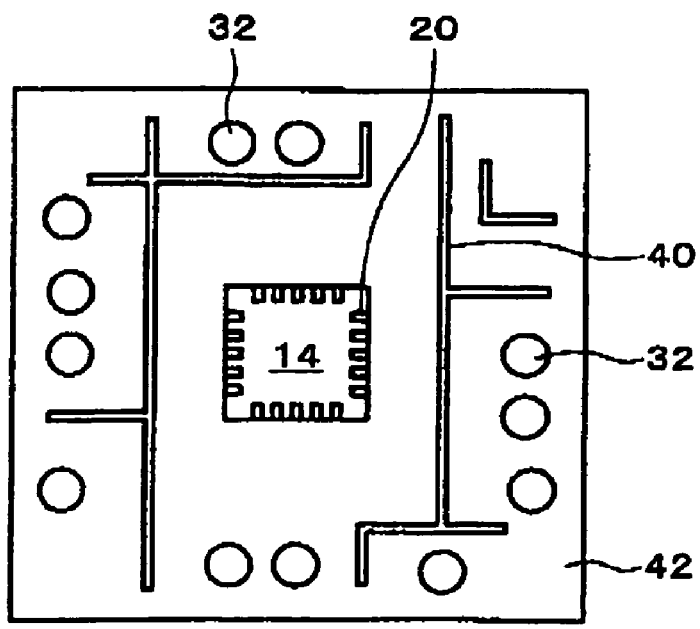
FIG. 4 is a view illustrating a method of manufacturing an interconnect substrate according to the first embodiment to which the present invention is applied.

As shown in FIG. 4, a second conductive layer (interconnect pattern including a plurality of lines, for example) 40 is formed. The second conductive layer 40 is formed so that a part of the second conductive layer 40 is disposed on the insulating layer 26 over the first conductive layer 20. The details of the first conductive layer 20 are applied to the second conductive layer 40. The second conductive layer 40 may be formed so that a part of the second conductive layer 40 is electrically connected with a part of the first conductive layer 20. For example, the second conductive layer 40 may be formed to pass over at least one post 30 (post 30 consisting only of the post 31, for example). This allows a part of the first conductive layer 20 to be electrically connected with a part of the second conductive layer 40 through the post 30. The first and second conductive layers 20 and 40 are electrically insulated from each other by the insulating layer 26 in the area other than the post 30. The second conductive layer 40 may be formed to avoid at least one post 31 (post 31 on which the post 32 is formed (see FIG. 3A) in more detail).

According to the present embodiment, since the first and second conductive layers 20 and 40 and the insulating layer 26 are formed by discharging drops, an increase in density of the interconnect structure can be achieved at low cost, whereby reliability and the degrees of freedom of manufacture can be increased.

Figure 5:
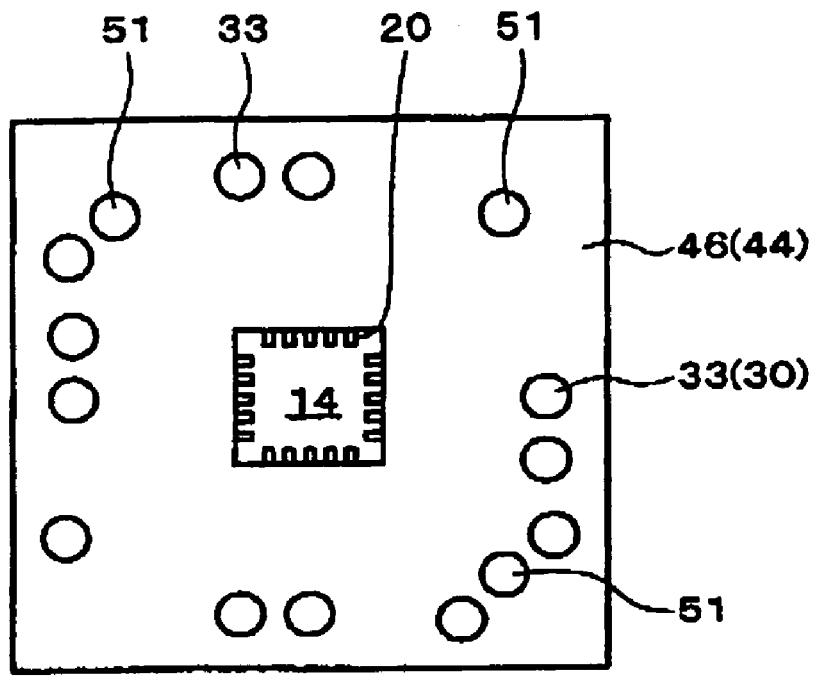
FIG. 5 is a view illustrating a method of manufacturing an interconnect substrate according to the first embodiment to which the present invention is applied.

As shown in FIG. 5, a second insulating layer 46 may be formed so that at least a part of the second insulating layer 46 is disposed on the second conductive layer 40. The second insulating layer 46 may be formed to avoid a part of the second conductive layer 40. The details of the insulating layer (first insulating layer) 26 are applied to the second insulating layer 46. For example, the second insulating layer 46 may be formed by a lower layer 42 shown in FIG. 4 and an upper layer 44 shown in FIG. 5. The details of the lower layer 22 and the upper layer 24 are applied to the lower layer 42 and the upper layer 44. The second insulating layer 46 may be formed to avoid a region in which the semiconductor chip 80 (see FIG. 11) is mounted (at least a part of the bottom of the depression section 14, for example).

The post 32 may be formed on any of the posts 31 shown in FIG. 3A. In this case, the second insulating layer 46 is formed to avoid a region in which at least one post 32 is formed. As shown in FIG. 5, the post 33 may be formed on the post 32. A post 50 (see FIG. 9) may be formed on the second conductive layer 40. The post 50 may consist of a post 51 shown in FIG. 5 formed on the second conductive layer 40 and posts 52 to 55 shown in FIGS. 6 to 9A formed on the post 51. The details of the post 30 are applied to the post 50.

Figure 6:
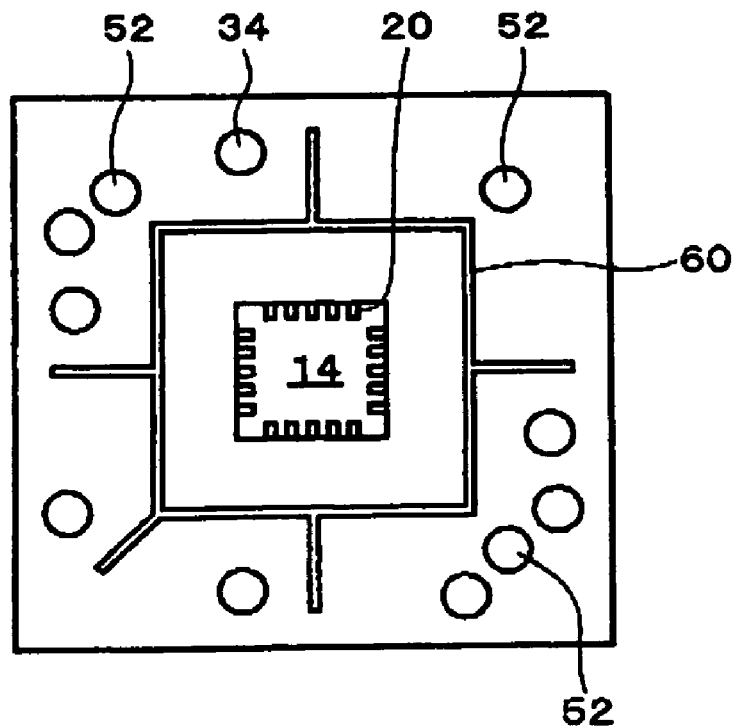
FIG. 6 is a view illustrating a method of manufacturing an interconnect substrate according to the first embodiment to which the present invention is applied.

As shown in FIG. 6, a third conductive layer 60 may be formed so that at least a part of the third conductive layer 60 is disposed on the second insulating layer 46 over the second conductive layer 40. The details of the first conductive layer 20 are applied to the third conductive layer 60. The third conductive layer 60 may be formed so that a part of the third conductive layer 60 is electrically connected with a part of the first conductive layer 20 or the second conductive layer 40. For example, the third conductive layer 60 may be formed to pass over at least one post 30 (post 30 consisting of the posts 31, 32, and 33, for example). This allows a part of the first conductive layer 20 to be electrically connected with a part of the third conductive layer 60 through the post 30. The third conductive layer 60 may be formed to pass over at least one post 51 (this example is not illustrated). This allows a part of the second conductive layer 40 to be electrically connected with a part of the third conductive layer 60 through the post 51. The first and second conductive layers 20 and 40 are electrically insulated from the third conductive section 60 by the second insulating layer 46 in the area other than the posts 30 and 51. The third conductive layer 60 may be formed to avoid at least one post 34 and at least one post 52.

Figure 7:
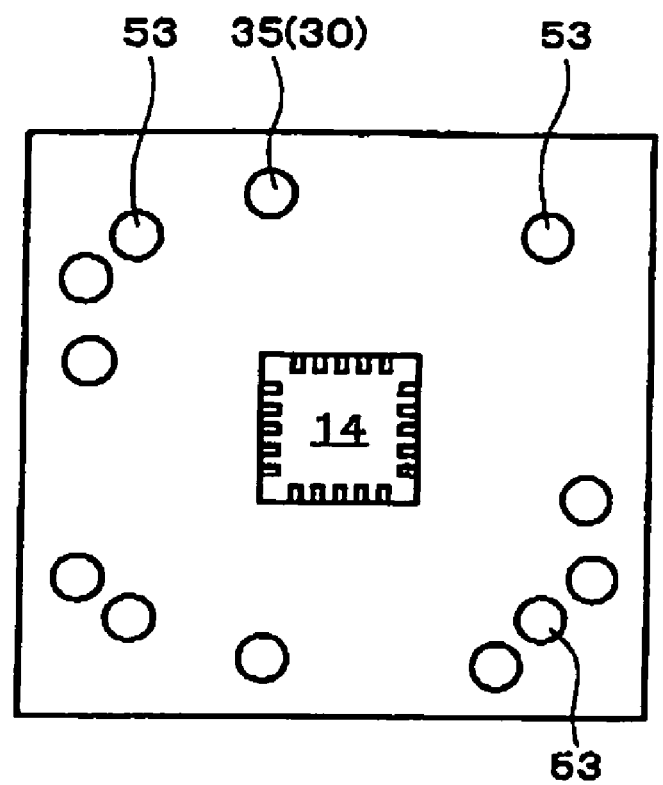
FIG. 7 is a view illustrating a method of manufacturing an interconnect substrate according to the first embodiment to which the present invention is applied.
Figure 8:
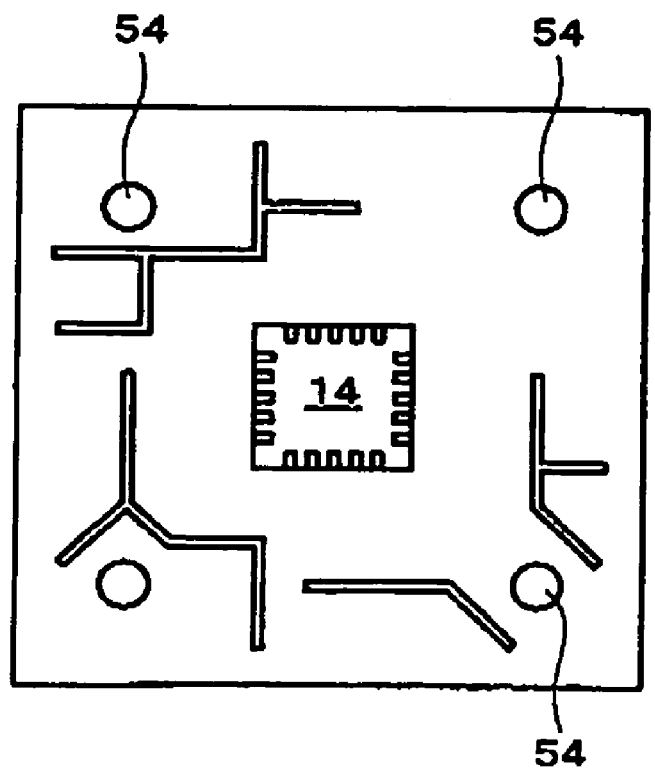
FIG. 8 is a view illustrating a method of manufacturing an interconnect substrate according to the first embodiment to which the present invention is applied.
Figure 9A:
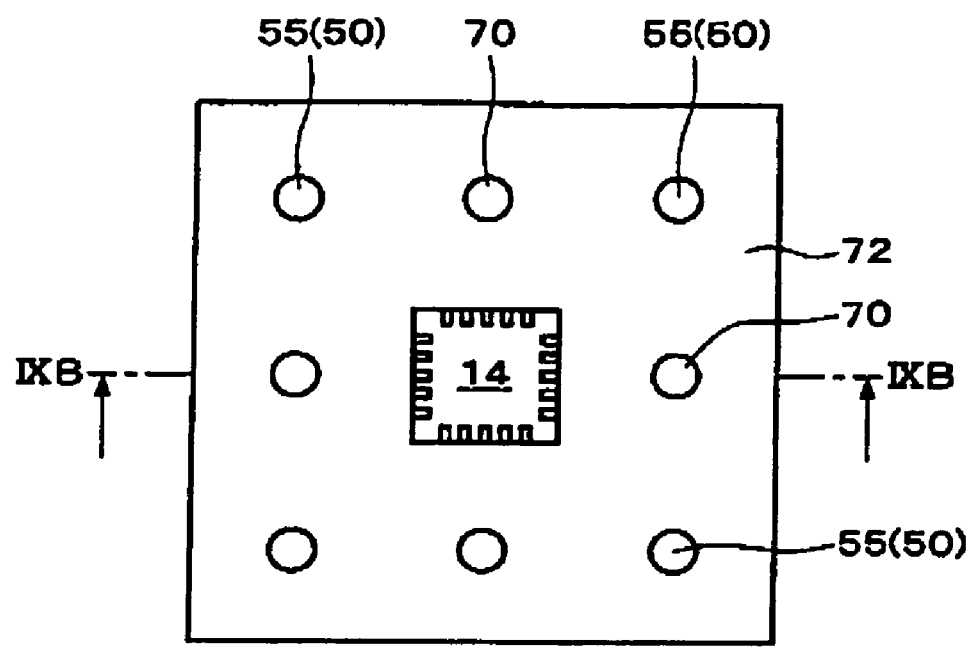
FIGS. 9A and 9B are views illustrating a method of manufacturing an interconnect substrate according to the first embodiment to which the present invention is applied.
Figure 9B:
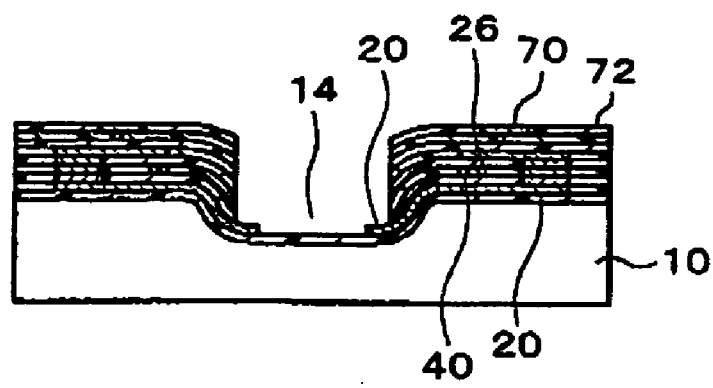

As shown in FIGS. 7 and 8, a conductive layer and an insulating layer are optionally stacked by repeating the above steps. As shown in FIGS. 9A and 9B, an insulating layer 72 may be formed so that the upper sides of the posts 50 and 70 are exposed. The post 50 is formed on the second conductive layer 40 and the post 70 is formed on the conductive layer other than the second conductive layer 40 or the post (details are omitted). The posts 50 and 70 may be formed at positions at which external terminals are formed. The number and arrangement of the posts 50 and 70 are not limited to those shown in FIG. 9A. The posts 50 and 70 may be arranged in the shape of a matrix (in a plurality of rows and columns) or in the shape of an area array.

Figure 10A:
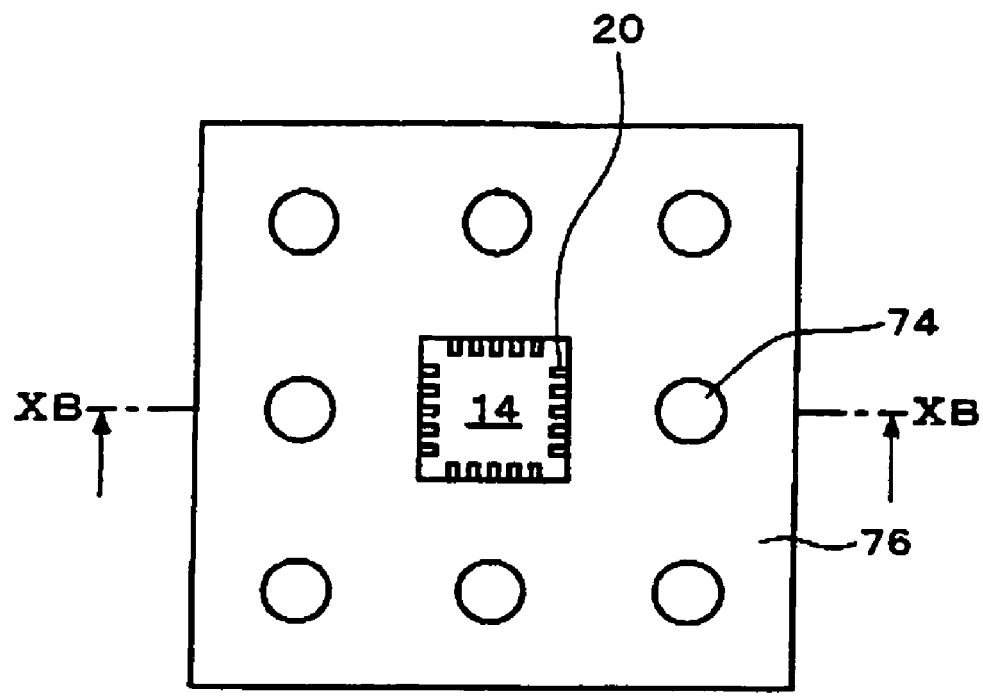
FIGS. 10A and 10B are views illustrating a method of manufacturing an interconnect substrate according to the first embodiment to which the present invention is applied.
Figure 10B:
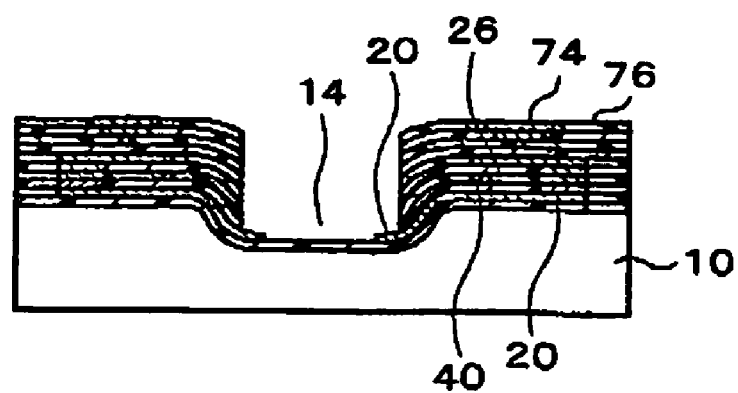

As shown in FIGS. 10A and 10B, lands 74 larger than the upper sides of the posts 50 and 70 may be formed on the posts 50 and 70. The lands 74 are electrically connected with one of the conductive layers (first conductive layer 20, for example) through the posts 50 and 70. At least one land 74 is electrically connected with the conductive layer which is electrically connected with the semiconductor chip (first conductive layer 20, for example). An insulating layer 76 may be formed so that at least a part of the lands 74 is exposed. The details of the first conductive layer 20 may be applied to the lands 74. The details of the insulating layer 26 may be applied to the insulating layer 76.

An interconnect substrate is manufactured in this manner. The interconnect substrate has a configuration derived from the above description. As shown in FIGS. 10A and 10B, a part of the first conductive layer 20 may be exposed. For example, a part of the first conductive layer 20 may be exposed inside the depression section 14 of the substrate 10. The exposed part of the first conductive layer 20 may be used for electrical connection with the semiconductor chip 80.

Figure 11:
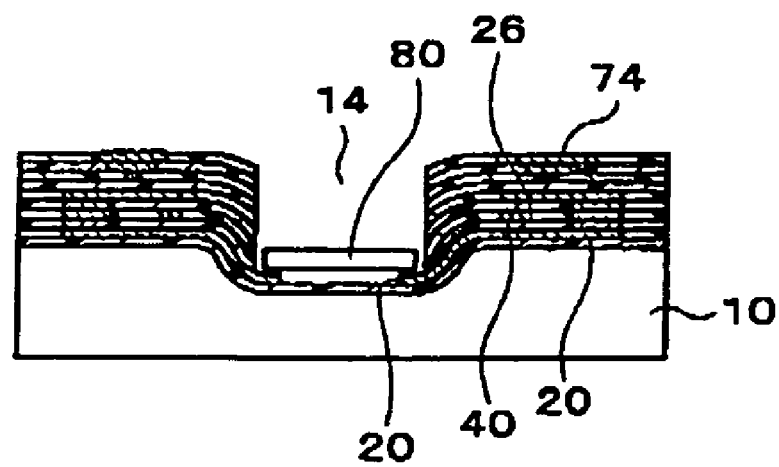
FIG. 11 is a view illustrating a method of manufacturing a semiconductor device according to the first embodiment to which the present invention is applied.
Figure 12:
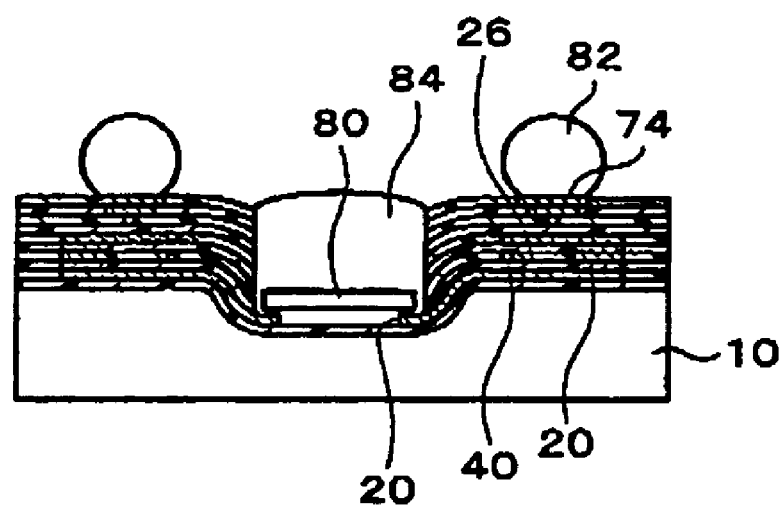
FIG. 12 is a view illustrating a method of manufacturing a semiconductor device according to the first embodiment to which the present invention is applied.

FIGS. 11 and 12 are views illustrating a method of manufacturing a semiconductor device. In the present embodiment, the semiconductor chip 80 is mounted on the above described interconnect substrate. The semiconductor chip 80 has a peripheral type pad arrangement in which pads are arranged on the periphery of the semiconductor chip 80. The exposed part of the first conductive layer 20 may be electrically connected with the semiconductor chip 80. The conductive layer other than the first conductive layer 20 (second conductive layer 40 or the conductive layer other than the first and second conductive layers 20 and 40, for example) may be electrically connected with the semiconductor chip 80. The semiconductor chip 80 may be mounted by applying face-down bonding as shown in FIG. 11, or applying face-up bonding in which the semiconductor chip 80 is electrically connected with the conductive layer through wires. The semiconductor chip 80 may be mounted in the depression section 14 of the substrate 10.

As shown in FIG. 12, the depression section 14 in which the semiconductor chip 80 is mounted may be filled with a resin 84 such as an epoxy resin. A filler metal 82 such as solder (soft solder or hard solder) may be provided to the land 74. The filler metal may be a solder ball or solder paste.

A semiconductor device according to the present embodiment includes the substrate 10 in which the depression section 14 is formed. The first conductive layer 20 is formed to pass through the depression section 14. At least a part of the insulating layer 26 is disposed on the first conductive layer 20. At least a part of the second conductive layer 40 is disposed on the insulating layer 26 over the first conductive layer 20. The semiconductor chip 80 is mounted in the depression section 14. The semiconductor chip 80 may be electrically connected with the first conductive layer 20. The semiconductor chip 80 may be electrically connected with the conductive layer other than the first and second conductive layers 20 and 40.

According to the present embodiment, since the first and second conductive layers and the insulating layers are formed by discharging drops, an increase in density of the interconnect structure can be achieved at low cost, whereby reliability and the degrees of freedom of manufacture can be increased.

Second Embodiment

Figure 13:
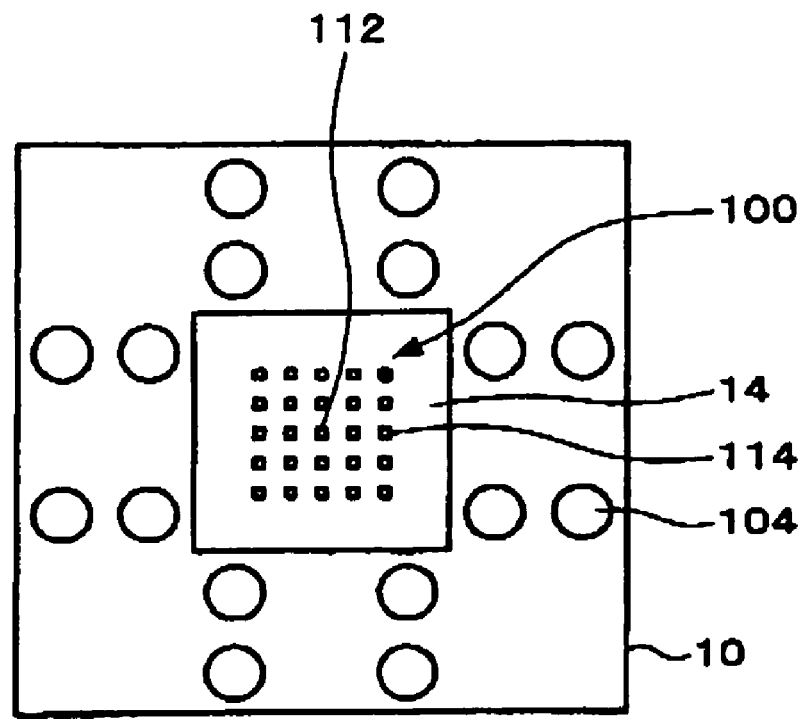
FIG. 13 is a view illustrating an interconnect substrate according to a second embodiment to which the present invention is applied.
Figure 14:
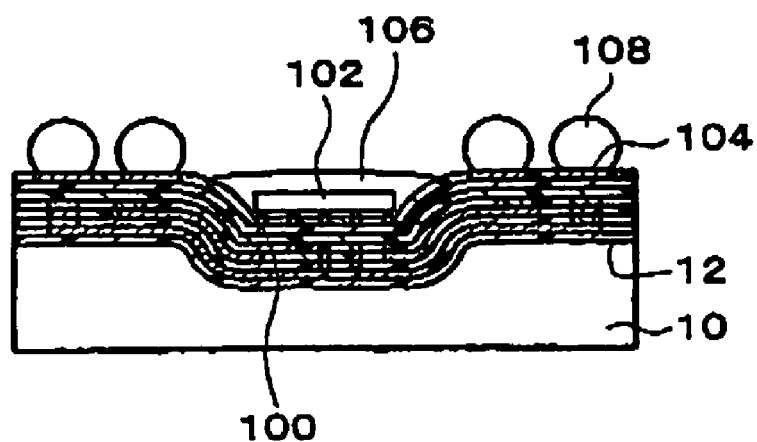
FIG. 14 is a view illustrating a semiconductor device according to the second embodiment to which the present invention is applied.

FIG. 13 is a plan view illustrating an interconnect substrate according to a second embodiment of the present invention. FIG. 14 is a cross-sectional view illustrating a semiconductor device using the interconnect substrate shown in FIG. 13. In the present embodiment, the substrate 10 described in the first embodiment is used. The depression section 14 is formed in the substrate 10. The insulating film 12 is formed on the substrate 10.

The interconnect substrate shown in FIG. 13 includes a plurality of lands 100. The lands 100 are formed in the uppermost layer of the interconnect substrate. The lands 100 may be disposed at the center (inside the depression section 14, for example) of the interconnect substrate. The lands 100 are arranged in the shape of an area array (in a plurality of rows and columns (three or more rows and three or more columns, for example) in the shape of a matrix, for example). The lands 100 are bonded to a semiconductor chip 102. The interconnect substrate may include lands 104 on which external terminals are formed in addition to the lands 100 bonded to the semiconductor chip 102.

As shown in FIG. 14, the semiconductor device includes the semiconductor chip 102. The semiconductor chip 102 has an area array type pad arrangement. The semiconductor chip 102 may be bonded face down to the interconnect substrate. Bumps may be formed on pads of the semiconductor chip 102. The pads of the semiconductor chip 102 are electrically connected with the lands 100.

The depression section 14 is formed in the substrate 10, and the lands 100 are formed over the bottom of the depression section 14. Therefore, the region in which the lands 100 are formed (center of the interconnect substrate, for example) is lower than the other region (end of the interconnect substrate, for example). The upper side (side opposite to the side on which the pads are formed) of the semiconductor chip 102 mounted on the interconnect substrate may be lower than the surface of the uppermost layer (land 104, for example) of the interconnect substrate outside the depression section 14. The semiconductor chip 102 may be covered with a resin 106. For example, the resin 106 may be provided to a depression which is formed corresponding to the depression section 14.

A filler metal 108 such as a solder (soft solder or hard solder) may be provided to the lands 104. The filler metal may be a solder ball or solder paste. At least one land 104 is electrically connected with at least one land 100.

Figure 15A:
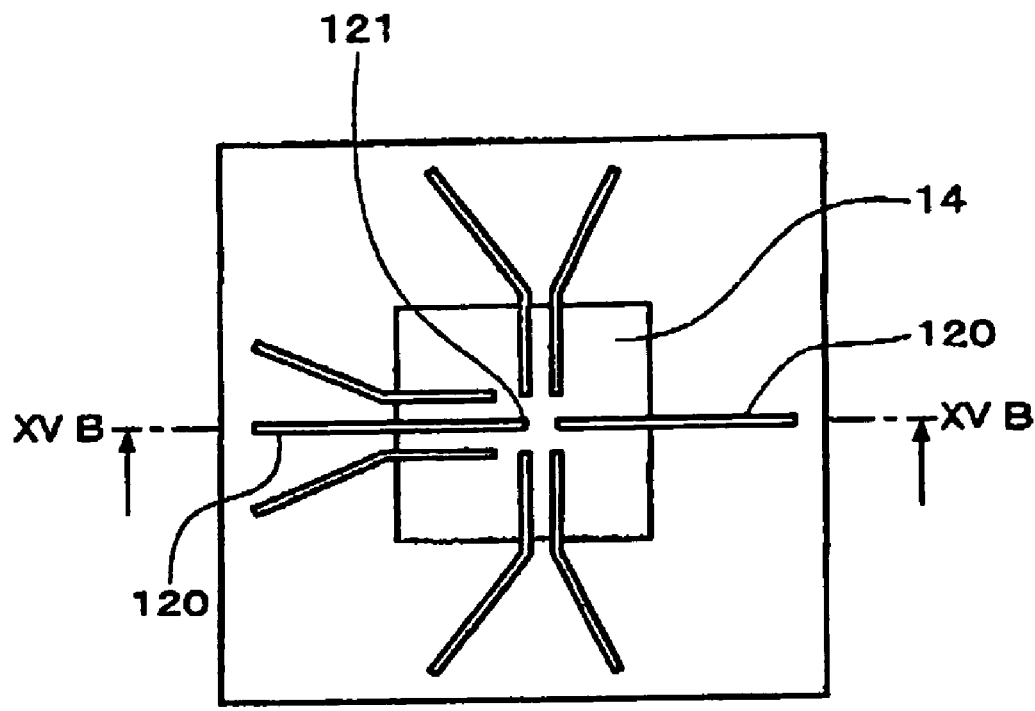
FIGS. 15A and 15B are views illustrating a method of manufacturing an interconnect substrate according to the second embodiment to which the present invention is applied.
Figure 15B:
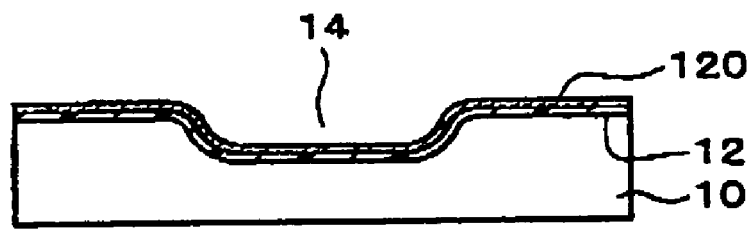

FIGS. 15A to 20 are views illustrating a method of manufacturing the interconnect substrate according to the second embodiment of the present invention. In the present embodiment, a first conductive layer 120 is formed as shown in FIGS. 15A and 15B. The first conductive layer 120 may be formed on the insulating film 12. The first conductive layer 120 may be the lowermost conductive layer among the conductive layers used for electrical connection. The first conductive layer 120 may be made up of a plurality of lines. A part (end, for example) of the line may be disposed to overlap a position at which one of the lands 100 (see FIG. 13) is formed. In more detail, a land 112 (see FIG. 13) among the plurality of lands 100 located on the inner side overlaps a part (part 121 of the line, for example) of the first conductive layer 120. The details (material, formation method, and the like) of the first conductive layer 20 described in the first embodiment are applied to the first conductive layer 120.

Figure 16A:
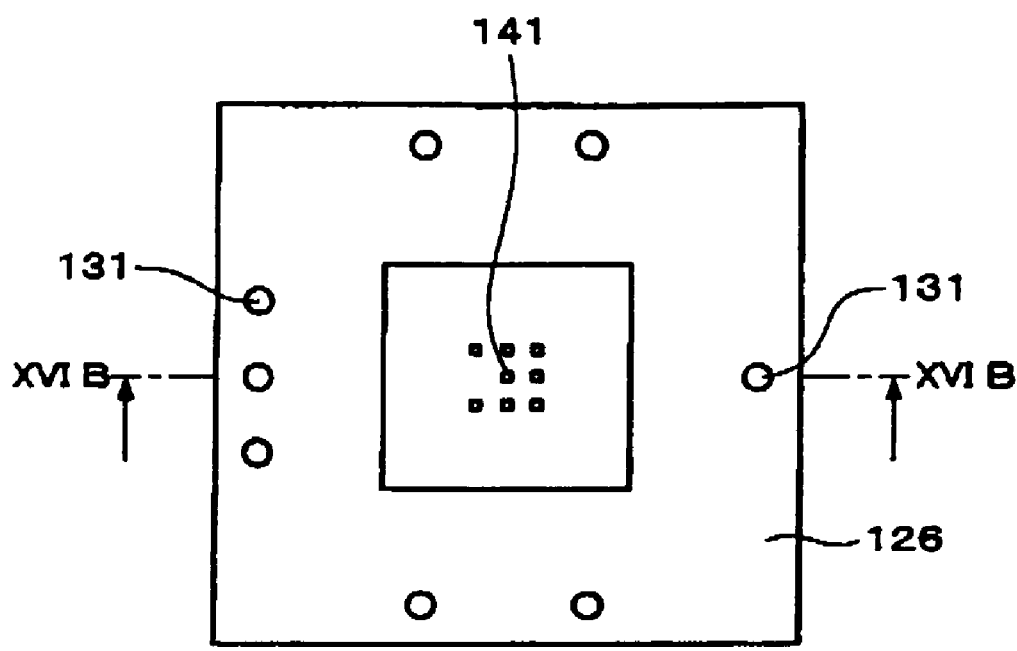
FIGS. 16A and 16B are views illustrating a method of manufacturing an interconnect substrate according to the second embodiment to which the present invention is applied.
Figure 16B:
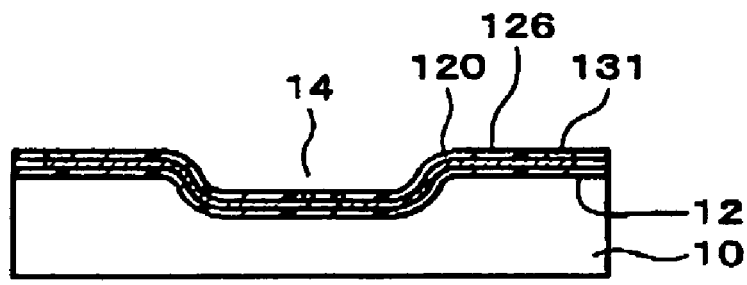

As shown in FIGS. 16A and 16B, an insulating layer 126 and a post 131 are formed. The details (material, formation method, and the like) of the insulating layer 26 and the post 31 described in the first embodiment are applied to the insulating layer 126 and the post 131. A post 141 is formed on a part (part 121 of the line shown in FIG. 15A, for example) of the first conductive layer 120. The post 141 is formed at a position corresponding to the pad of the semiconductor chip 102 (position at which the land 100 is formed). The post 141 may be formed only at a position corresponding to the land 112 (see FIG. 13) among the plurality of lands 100 located on the inner side. The details (material, formation method, and the like) of the post 141 may be the same as the details of the post 131.

Figure 17A:
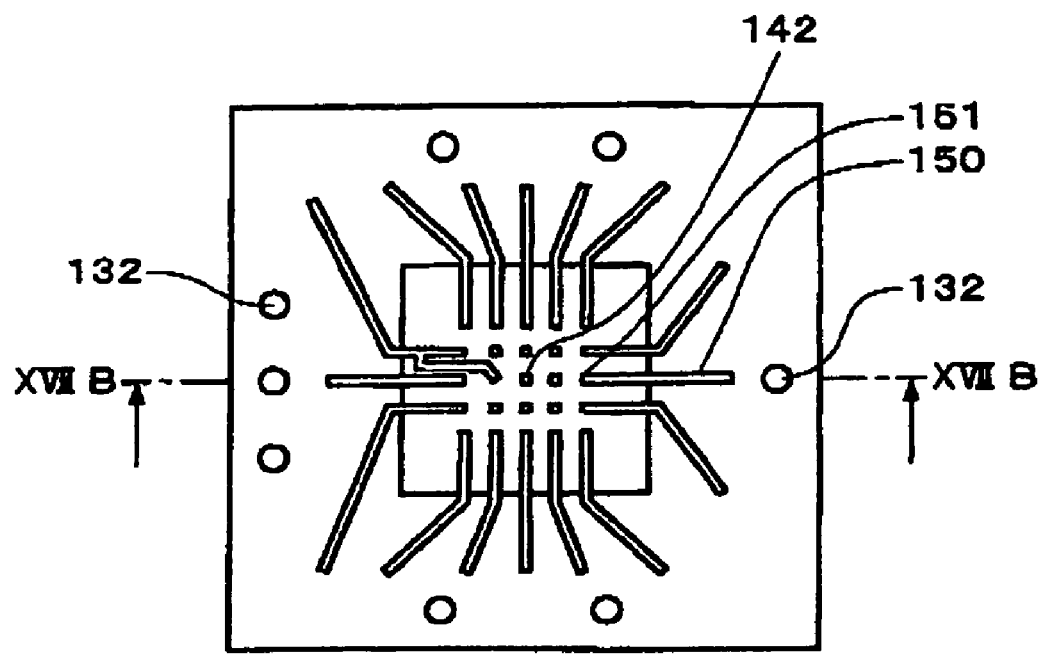
FIGS. 17A and 17B are views illustrating a method of manufacturing an interconnect substrate according to the second embodiment to which the present invention is applied.
Figure 17B:
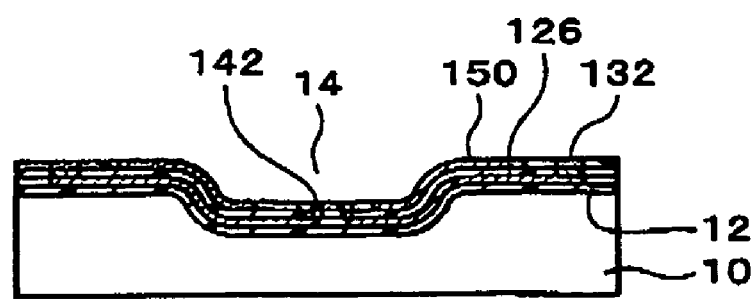

As shown in FIGS. 17A and 17B, a second conductive layer 150 is formed. The second conductive layer 150 is formed on the insulating layer 126. The details (material, formation method, and the like) of the second conductive layer 40 described in the first embodiment are applied to the second conductive layer 150. A part (end, for example) 151 of one of the plurality of lines which make up the second conductive layer 150 may be disposed at a position corresponding to the land 100. The part 151 of the line is disposed at a position corresponding to the land 114 (see FIG. 13) located on the outer side of the part 121 (see FIG. 15A) of the line formed in advance.

Posts 132 and 142 are respectively formed on the posts 131 and 141. The details (material, formation method, and the like) of the posts 132 and 142 may be the same as the details of the posts 131 and 141. The second conductive layer 150 may be formed to pass over at least one of the posts 141 and 131 (not shown in FIGS. 17A and 17B).

Figure 18A:
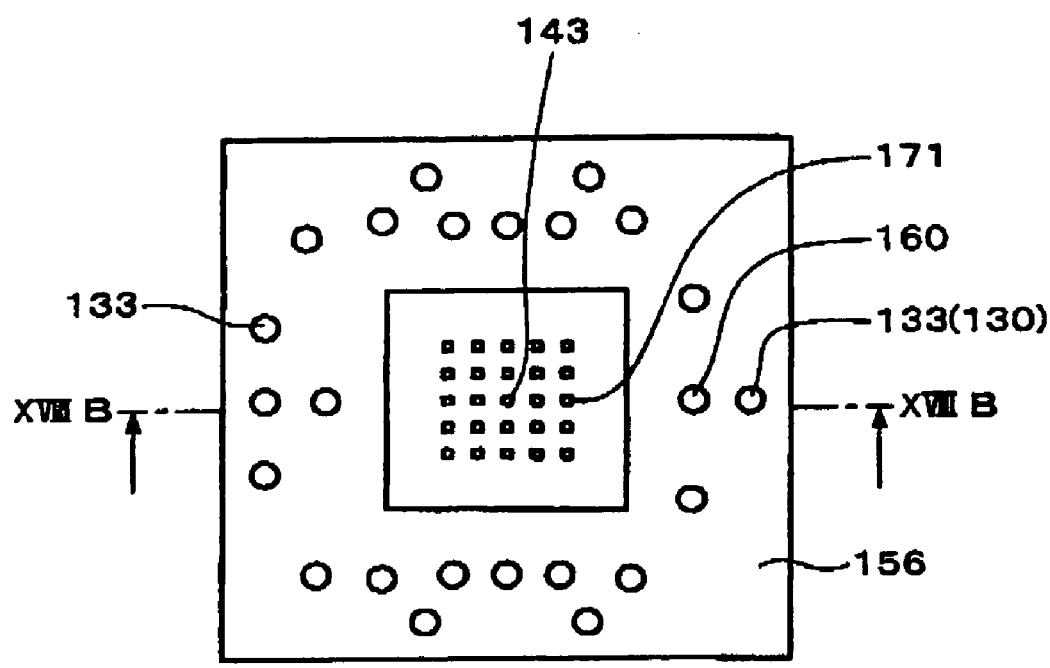
FIGS. 18A and 18B are views illustrating a method of manufacturing an interconnect substrate according to the second embodiment to which the present invention is applied.
Figure 18B:
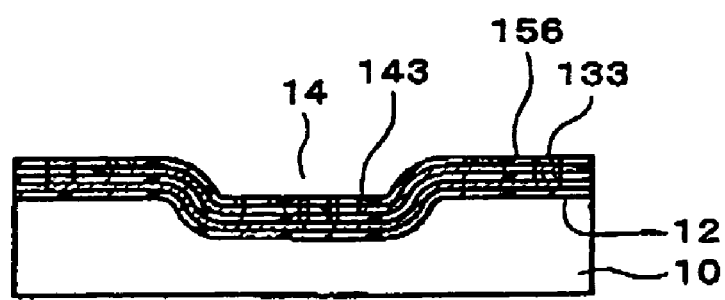

As shown in FIGS. 18A and 18B, a second insulating layer 156 is formed. A post 133 may be formed on the post 132. The stacked posts 131, 132, and 133 may be referred to as one post 130 in the case where a post is not formed on the post 133. A post 160 may be formed on the second conductive layer 150. A post 143 may be formed on the post 142. A post 171 may be formed on the second conductive layer 150 (end 151 of the line, for example). The details (material, formation method, and the like) of the second insulating layer 156 may be the same as the details of the second insulating layer 46 described in the first embodiment. The details (material, formation method, and the like) of the posts 133, 160, 143, and 171 may be the same as the details of the post 131.

Figure 19:
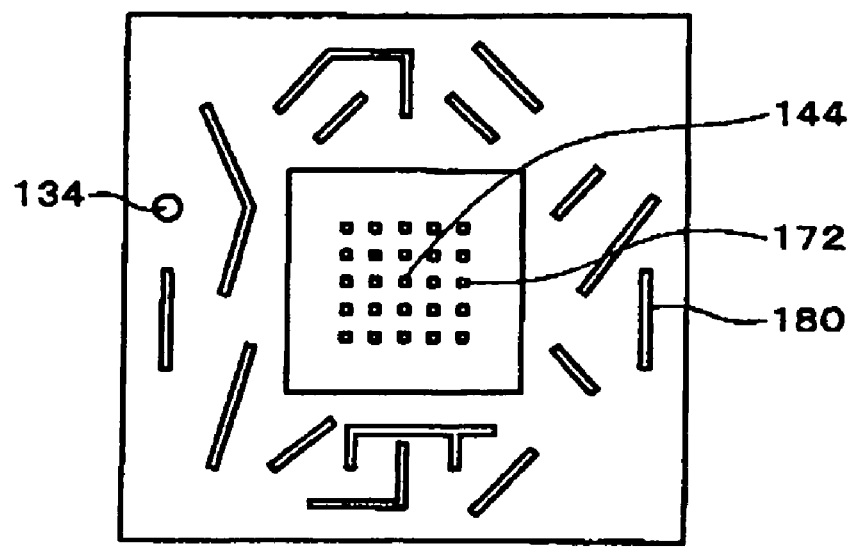
FIG. 19 is a view illustrating a method of manufacturing an interconnect substrate according to the second embodiment to which the present invention is applied.

As shown in FIG. 19, a third conductive layer 180 may be formed. The third conductive layer 180 is formed on the second insulating layer 156. The third conductive layer 180 may be formed to pass over the post 130. The details (material, formation method, and the like) of the second conductive layer 40 described in the first embodiment are applied to the third conductive layer 180. Posts 144 and 172 are respectively formed on the posts 143 and 171. The details (material, formation method, and the like) of the posts 144 and 172 may be the same as the details of the post 141.

Figure 20:
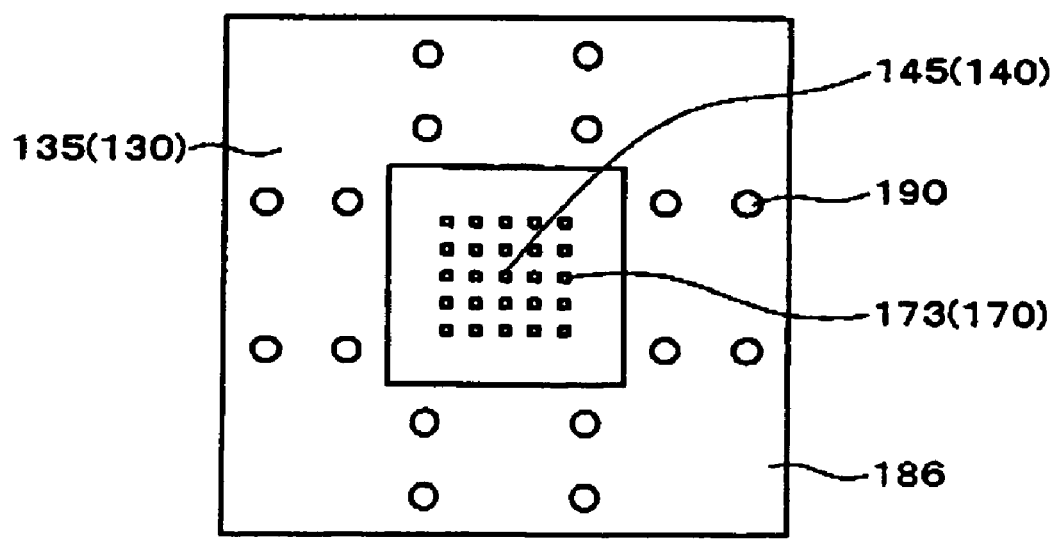
FIG. 20 is a view illustrating a method of manufacturing an interconnect substrate according to the second embodiment to which the present invention is applied.

As shown in FIG. 20, a third insulating layer 186 may be formed. A post 135 may be formed on the post 134. The stacked posts 131 to 135 may be referred to as one post 130 in the case where a post is not formed on the post 135. A post 190 may be formed on the third conductive layer 180. Posts 145 and 173 may be respectively formed on the posts 144 and 172. The stacked posts 141 to 145 (or posts 171 to 173) may be referred to as one post 140 (or post 170) in the case where a post is not formed on the post 145 (or post 173). The details (material, formation method, and the like) of the third insulating layer 186 may be the same as the details of the second insulating layer 46 described in the first embodiment. The details (material, formation method, and the like) of the posts 135, 190, 145, and 173 may be the same as the details of the post 131.

As shown in FIG. 13, the lands 104 may be formed on the posts 130 and 190. The surfaces of the posts 140 and 170 may be the lands 112 and 114, or the lands may be formed by forming a conductive layer on the posts 140 and 170.

The details described in other embodiments may be applied to the present embodiment. The details described in the present embodiment may be applied to other embodiments.

Third Embodiment

Figure 21A:
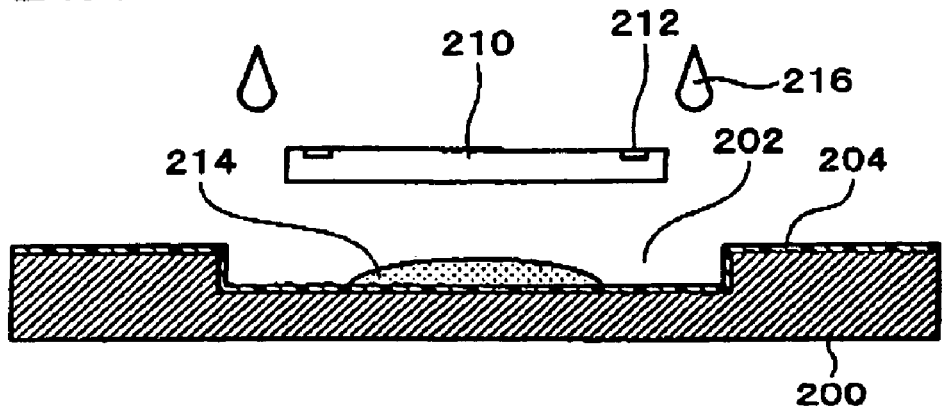
FIGS. 21A to 21C are views illustrating a method of manufacturing a semiconductor device according to a third embodiment to which the present invention is applied.
Figure 21B:
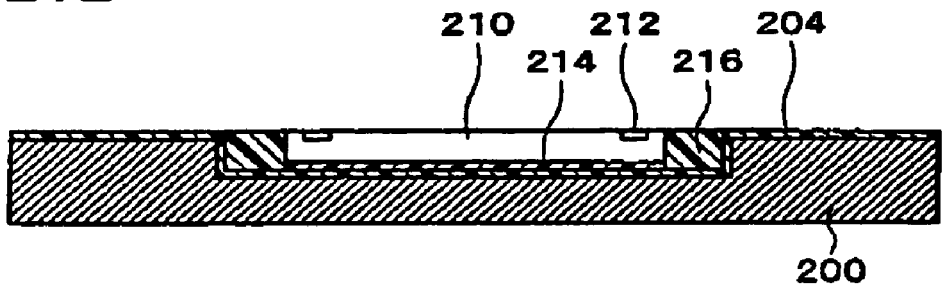
Figure 21C:
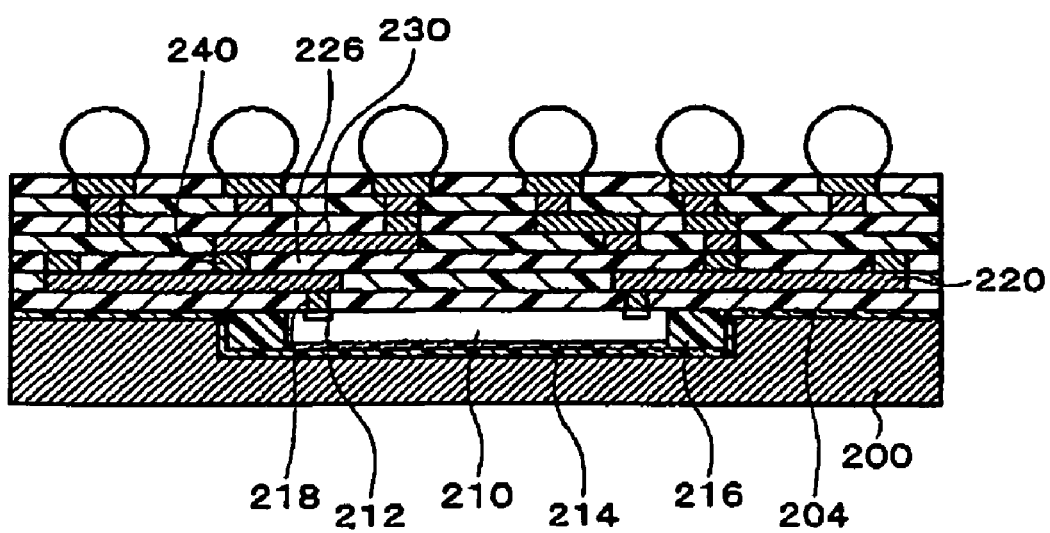

FIGS. 21A to 21C are views illustrating a method of manufacturing a semiconductor device according to a third embodiment of the present invention. In the present embodiment, a semiconductor chip 210 is mounted on a substrate 200 so that the surface of the semiconductor chip 210 on which electrodes 212 are formed faces upward, as shown in FIG. 21A. An insulating layer 204 may be formed on the substrate 200. The substrate 200 may include a depression section 202. The inner wall surface of the depression section 202 may be formed perpendicularly to the substrate 200 or inclined with respect to the substrate 200. The inner wall surface of the depression section 202 may be a curved surface (protruding surface or depressed surface). The semiconductor chip 210 may be mounted in the depression section 202. The substrate 200 may be bonded to the semiconductor chip 210 through an adhesive 214. The depression section 202 in which the semiconductor chip 210 is mounted may be filled with a resin 216. As shown in FIG. 21B, a resin layer is formed in the depression section 202 in which the semiconductor chip 210 is mounted by using the resin 216.

As shown in FIG. 21C, a first conductive layer 220 is formed over the substrate 200 (region surrounding the depression section 202, for example) and the semiconductor chip 210. The first conductive layer 220 is formed to be electrically connected with the electrodes 212 of the semiconductor chip 210. For example, bumps 218 may be formed on the electrodes 212, and the first conductive layer 220 may be formed to pass over the bumps 218. The first conductive layer 220 may be formed to pass over the resin layer formed by the resin 216. An insulating material (film or layer) may be interposed between the semiconductor chip 210 and the first conductive layer 220. An insulating layer 226 is formed so that at least a part of the insulating layer 226 is disposed on the first conductive layer 220. A second conductive layer 230 is formed so that at least a part of the second conductive layer 230 is disposed on the insulating layer 226 over the first conductive layer 220. The first and second conductive layers 220 and 230 may be electrically connected (bonded) through posts 240.

The details (material, formation method, and the like) of the first and second conductive layers 20 and 40 and the insulating layer 26 described in the first embodiment are applied to the first and second conductive layers 220 and 230 and the insulating layer 226. The bump 218 may be formed by using the same method as the first conductive layer 220. An insulating layer, a conductive layer, and a post may be further stacked on the second conductive layer 230. The details are the same as described in the first and second embodiments.

A semiconductor device is manufactured in this manner. The semiconductor device has a configuration derived from the above manufacturing method. In the present embodiment, the effects described in the first embodiment can be achieved. The details described in other embodiments may be applied to the present embodiment. The details described in the present embodiment may be applied to other embodiments.

Fourth Embodiment

Figure 22A:
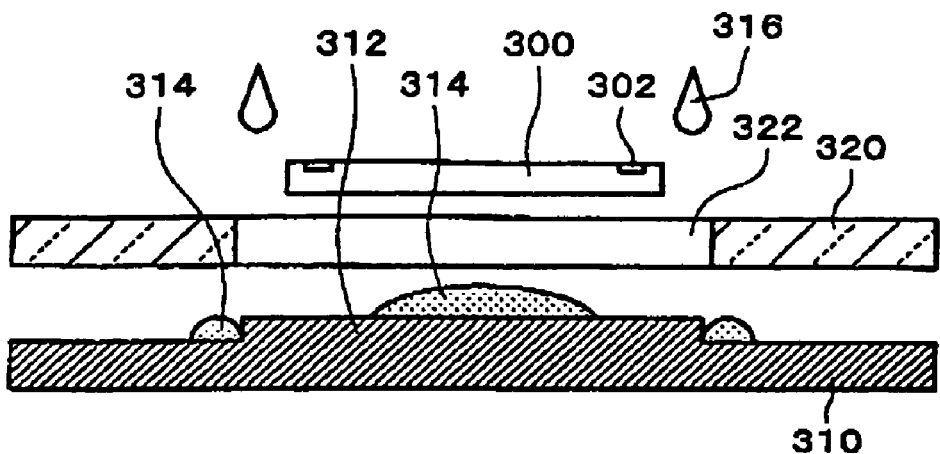
FIGS. 22A to 22C are views illustrating a method of manufacturing a semiconductor device according to a fourth embodiment to which the present invention is applied.
Figure 22B:
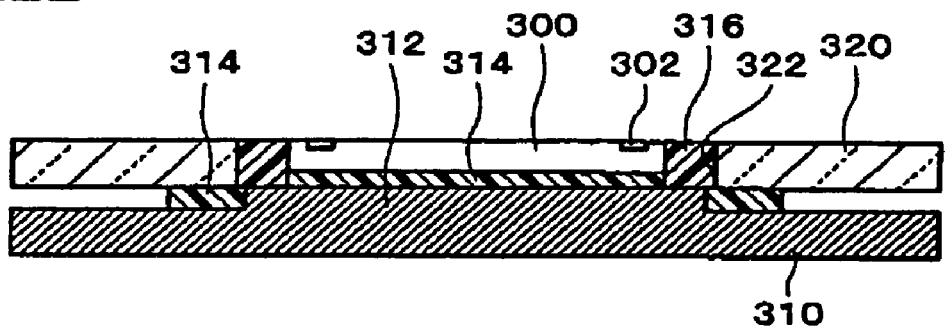
Figure 22C:
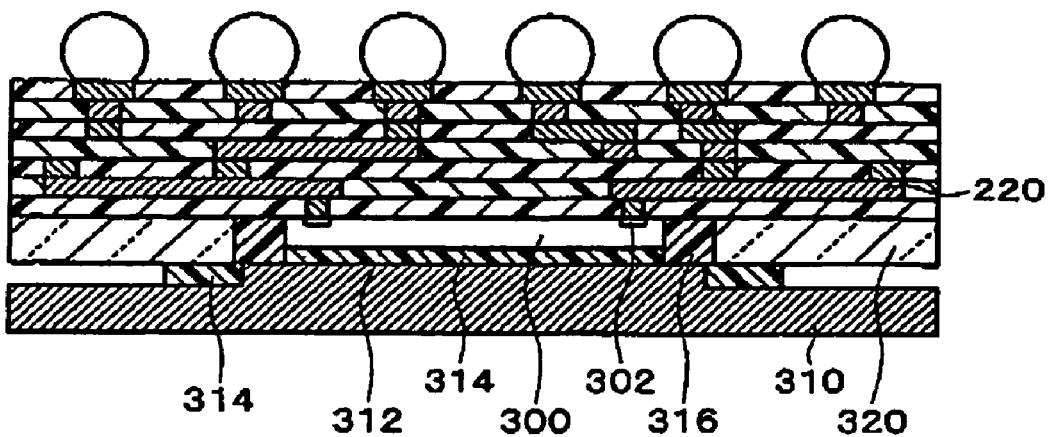

FIGS. 22A to 22C are views illustrating a method of manufacturing a semiconductor device according to a fourth embodiment of the present invention. In the present embodiment, a semiconductor chip 300 is mounted on a first substrate 310 so that the surface of the semiconductor chip 300 on which electrodes 302 are formed faces upward, as shown in FIG. 22A. The first substrate 310 may include a protruding section 312. In this case, the semiconductor chip 300 may be mounted on the protruding section 312. The first substrate 310 may be bonded to the semiconductor chip 300 through an adhesive 314. In the case where the first substrate 310 is a conductor, an insulating film may be formed on the surface of the first substrate 310, or the first substrate 310 may be electrically insulated from the semiconductor chip 300 by the adhesive 314.

A second substrate 320 having a shape so as to avoid the semiconductor chip 300 (having a hole 322, for example) is attached to the first substrate 310. The protruding section 312 of the first substrate 310 may be disposed inside the hole 322. The first and second substrates 310 and 320 may be bonded through the adhesive 314. The second substrate (glass plate or ceramic substrate, for example) 320 may have a coefficient of thermal expansion closer to the coefficient of thermal expansion of the semiconductor chip 300 than that of the first substrate (metal plate, for example) 310. The first substrate 310 may be a heat sink.

The hole 322 may be filled with a resin 316. A resin layer may be formed by the resin 316 inside the hole 322, as shown in FIG. 22B.

As shown in FIG. 22C, the first conductive layer 220 is formed over the second substrate 320 and the semiconductor chip 300 so that the first conductive layer 220 is electrically connected with the electrodes 302 of the semiconductor chip 300. Since the subsequent steps are the same as the steps described in the third embodiment, further description is omitted. A semiconductor device is manufactured in this manner. The semiconductor device has a configuration derived from the above manufacturing method. In the present embodiment, the effects described in the first embodiment can also be achieved. The details described in other embodiments may be applied to the present embodiment. The details described in the present embodiment may be applied to other embodiments.

Fifth Embodiment

Figure 23:
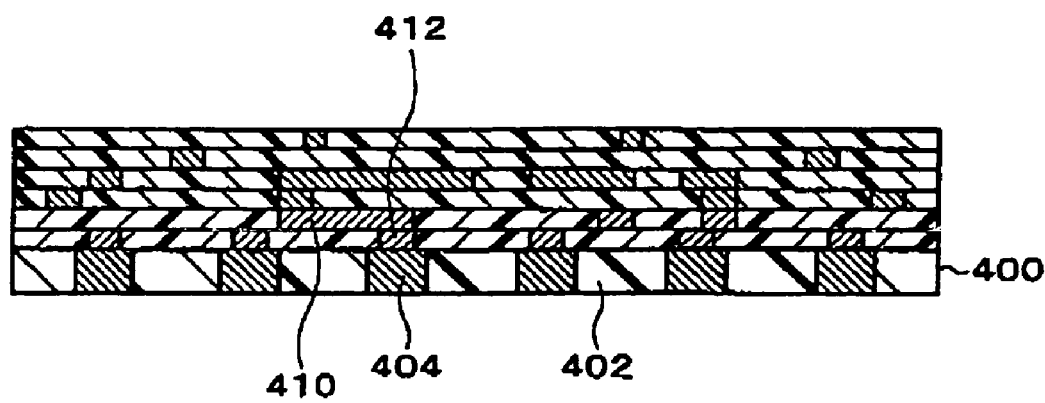
FIG. 23 is a view illustrating an interconnect substrate according to a fifth embodiment to which the present invention is applied.

FIG. 23 is a view illustrating an interconnect substrate according to a fifth embodiment of the present invention. In the present embodiment, a substrate 400 includes an insulating section (section formed of ceramic or a resin such as an epoxy resin or a polyimide resin, for example) 402, and a conductive section (section formed of a metal, for example) 404 which is formed through the insulating section 402. The surface of the conductive section 404 exposed from the insulating section 402 may be in the shape of a land.

A first conductive layer 410 is formed over the insulating section 402 and the conductive section 404 so that the first conductive layer 410 is electrically connected with the conductive section 404. For example, a post 412 may be formed on the conductive section 404, and the first conductive layer 410 may be formed to pass over the post 412. The details described in the first to fourth embodiments are applied to the subsequent steps. Specifically, insulating layers and conductive layers are stacked on the first conductive layer 410 to form a high-density interconnect structure.

Figure 24:
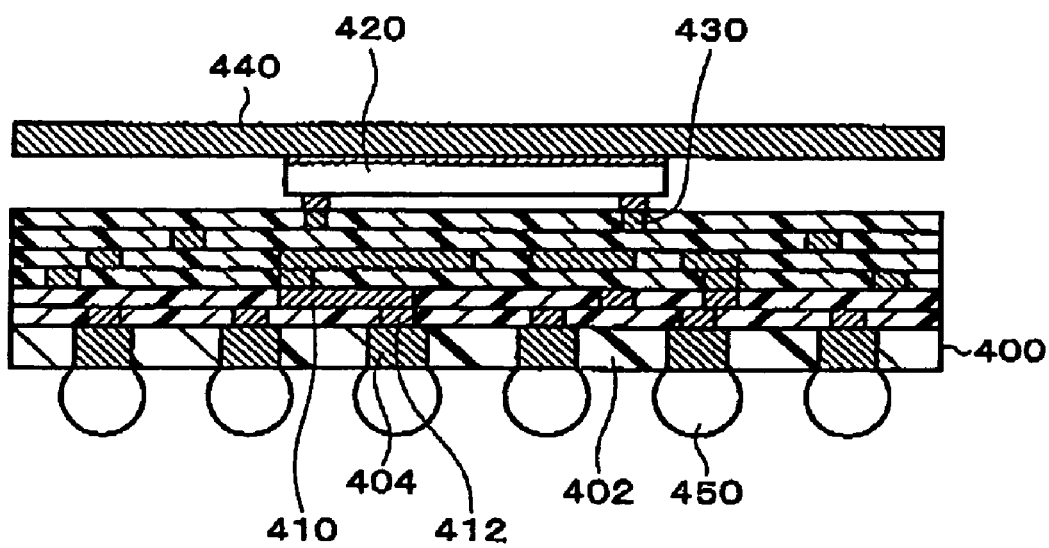
FIG. 24 is a view illustrating a semiconductor device according to the fifth embodiment to which the present invention is applied.

As shown in FIG. 24, the semiconductor chip 420 is electrically connected with pads 430. A semiconductor device is manufactured in this manner. If necessary, a heat sink 440 may be provided to the semiconductor chip 420. A filler metal 450 such as a solder ball may be provided to the conductive section 404. In the present embodiment, the effects described in the first embodiment can also be achieved. The details described in other embodiments may be applied to the present embodiment. The details described in the present embodiment may be applied to other embodiments.

Sixth Embodiment

Figure 25A:
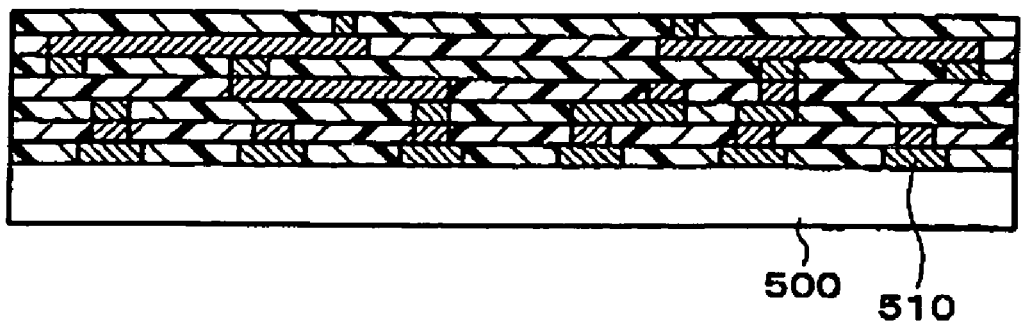
FIGS. 25A and 25B are views illustrating a method of manufacturing an interconnect substrate according to a sixth embodiment to which the present invention is applied.
Figure 25B:
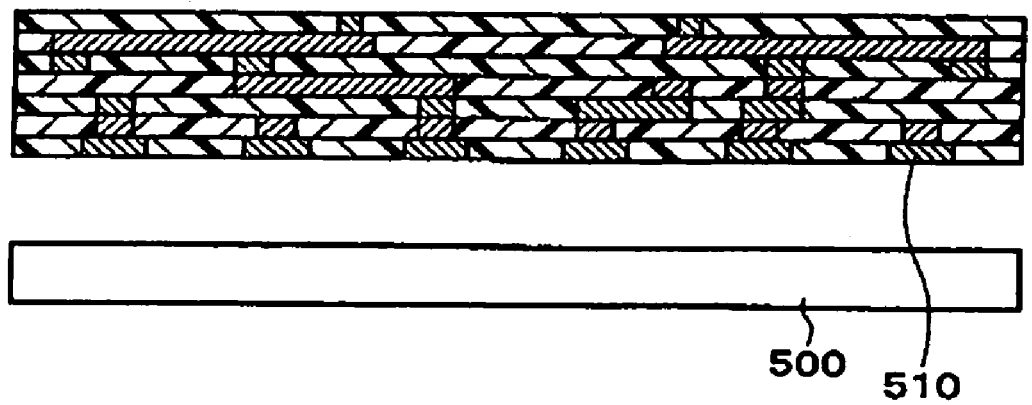

FIGS. 25A and 25B are views illustrating an interconnect substrate according to a sixth embodiment of the present invention. In the present embodiment, a first conductive layer 510 is formed on a substrate (metal plate, glass substrate, or resist film) 500, and insulating layers and conductive layers are stacked on the first conductive layer 510 to form a high-density interconnect structure, as shown in FIG. 25A. The details are the same as described in the first to fifth embodiments.

As shown in FIG. 25B, the substrate 500 is removed from the first conductive layer 510 (from the multilayer substrate including the first conductive layer 510 in more detail). An interconnect substrate is obtained in this manner. A semiconductor device can be manufactured by mounting a semiconductor chip on the interconnect substrate. In the present embodiment, the effects described in the first embodiment can also be achieved. The details described in other embodiments may be applied to the present embodiment. The details described in the present embodiment may be applied to other embodiments.

Seventh Embodiment

Figure 26A:
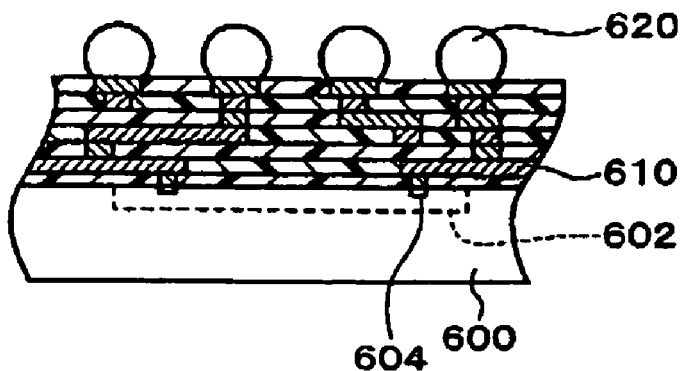
FIGS. 26A to 26C are views illustrating a method of manufacturing a semiconductor device according to a seventh embodiment to which the present invention is applied.
Figure 26B:
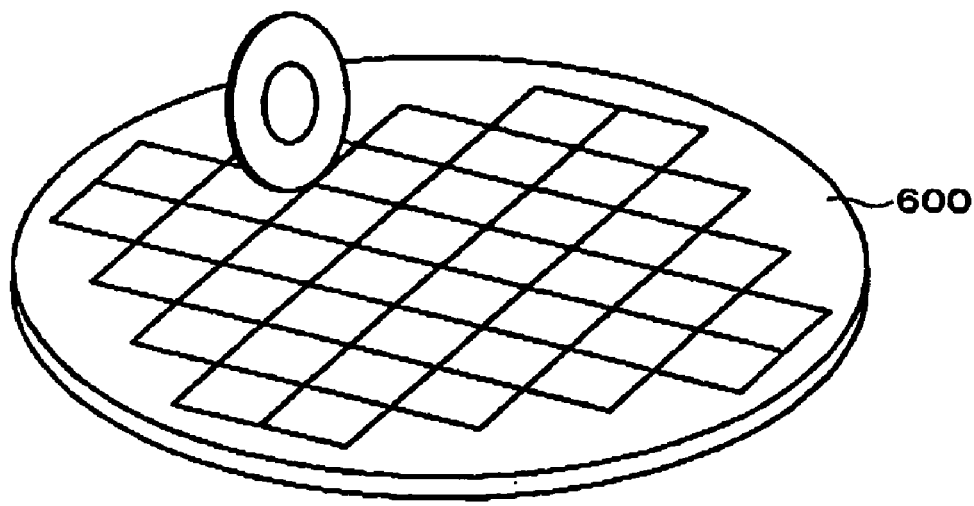
Figure 26C:
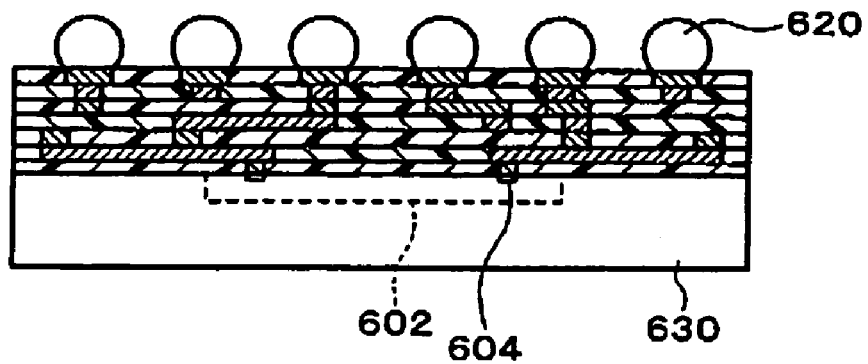

FIGS. 26A to 26C are views illustrating a method of manufacturing a semiconductor device according to a seventh embodiment of the present invention. In the present embodiment, a first conductive layer 610 is formed on a semiconductor wafer 600 on which a plurality of integrated circuits 602 are formed so that the first conductive layer 610 is electrically connected with electrodes 604 of the integrated circuits 602. Insulating layers and conductive layers are stacked on the first conductive layer 610 to form a high-density interconnect structure, as shown in FIG. 26A. The details are the same as described in the first to sixth embodiments. A filler metal 620 such as a solder ball is optionally provided.

The semiconductor wafer 600 is cut as shown in FIG. 26B, whereby a semiconductor device is manufactured as shown in FIG. 26C. The semiconductor device includes a semiconductor chip 630, a high-density interconnect structure which is formed by stacking insulating layers and conductive layers on the semiconductor chip 630, and the filler metal 620. In the present embodiment, the effects described in the first embodiment can also be achieved. The details described in other embodiments may be applied to the present embodiment. The details described in the present embodiment may be applied to other embodiments.

Eighth Embodiment

Figure 27A:
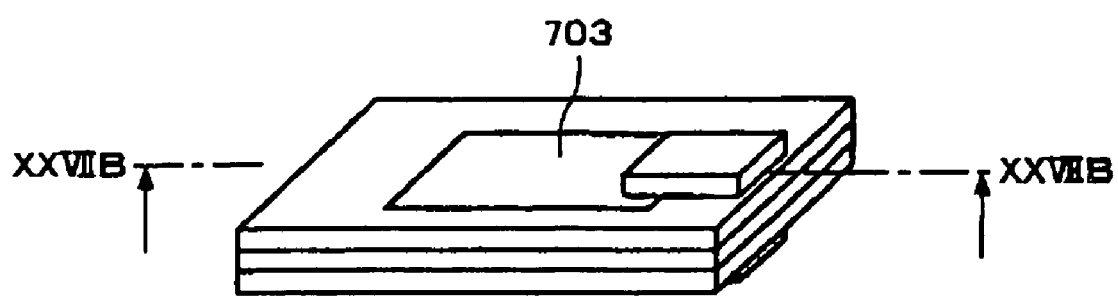
FIGS. 27A and 27B are views illustrating a method of manufacturing an electronic component according to an eighth embodiment to which the present invention is applied.
Figure 27B:
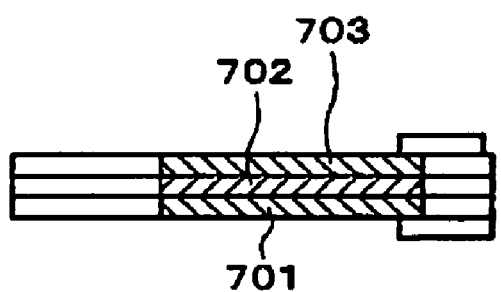

FIGS. 27A and 27B are views illustrating a method of manufacturing an electronic component which can be applied to the embodiment of the present invention. An electronic component may be formed on the surface on which a first conductive layer is formed, an insulating layer, or a second insulating layer.

The method of manufacturing an electronic component according to the present embodiment includes forming each of a plurality of parts which make up one electric part by discharging drops of a solvent containing fine particles of a material. As shown in FIGS. 27A and 27B, first, second, and third layers 701, 702, and 703 are formed, for example. The first, second, and third layers 701, 702, and 703 may be stacked or formed to be adjacent to each other.

In the case of forming a capacitor, the first and third layers 701 and 703 are formed of a conductor and the second layer 702 is formed of an insulating material. In the case of forming the first and third layers 701 and 703 by using gold, "Perfect Gold" (manufactured by Vacuum Metallurgical Co., Ltd.) may be used. In the case of forming the first and third layers 701 and 703 by using silver, "Perfect Silver" (manufactured by Vacuum Metallurgical Co., Ltd.) may be used. As an insulating material for forming the second layer 702, $SiO_2$, $Al_2O_3$, dielectrics such as $SrTiO_3$, $BaTiO_3$, and $Pb(Zr,Ti)O_3$, and the like can be given. As a solvent, PGMEA, cyclohexane, carbitol acetate, and the like can be given. Glycerol, diethylene glycol, ethylene glycol, or the like may optionally be added as a wetting agent or a binder. As a fluid containing an insulating material, a polysilazane or a metal alkoxide containing an insulating material may be used. In this case, an insulating material may be formed by heating or a chemical reaction. The width and length of the second layer 702 and the dielectric constant of the insulating material are determined depending on the capacitance of the capacitor to be formed. The capacitance of the capacitor is determined depending on the areas of the first and third layers 701 and 703 which become common electrodes, the distance between the first and third layers 701 and 703, and the dielectric constant of the second layer 702. In the case of increasing the thickness of the first layer 701, second layer 702, or third layer 703, layers may be stacked by forming a solidified layer of a fluid and discharging the same fluid onto the solidified layer and solidifying the fluid.

At least one of the first, second, and third layers 701, 702, and 703 may be a resistor. As a resistance material, a mixture of conductive powder and insulating powder, Ni—Cr, Cr—SiO, Cr—MgF, Au—$SiO_2$, AuGgF, $PtTa_2O_5$, $AuTa_2O_5Ta_2$, $Cr_3Si$, $TaSi_2$, and the like can be given. As a solvent, PGMEA, cyclohexane, carbitol acetate, and the like can be given. Glycerol, diethylene glycol, ethylene glycol, or the like may optionally be added as a wetting agent or a binder. As a fluid containing an insulating material, a polysilazane or a metal alkoxide containing an insulating material may be used. In this case, an insulating material may be formed by heating or a chemical reaction. The resistance material is determined depending on the resistance value of the resistor to be formed. The width, height, and length of the resistance film are determined depending on the resistance value of the resistor to be formed. This is because the resistance value of the resistor is in proportion to the length and is in inverse proportion to the cross-sectional area.

A part of the first conductive layer 20 described in the first embodiment and the like may be formed by using a resistance material. A diode and a transistor may be formed. In this case, the first, second, and third layers 701, 702, and 703 are formed by discharging drops of a solvent containing fine particles of a semiconductor material.

Figure 28:
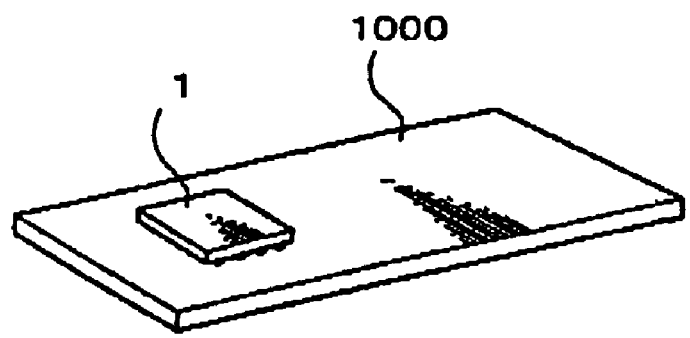
FIG. 28 is a view showing a circuit board on which a semiconductor device according to an embodiment to which the present invention is applied is mounted.
Figure 29:
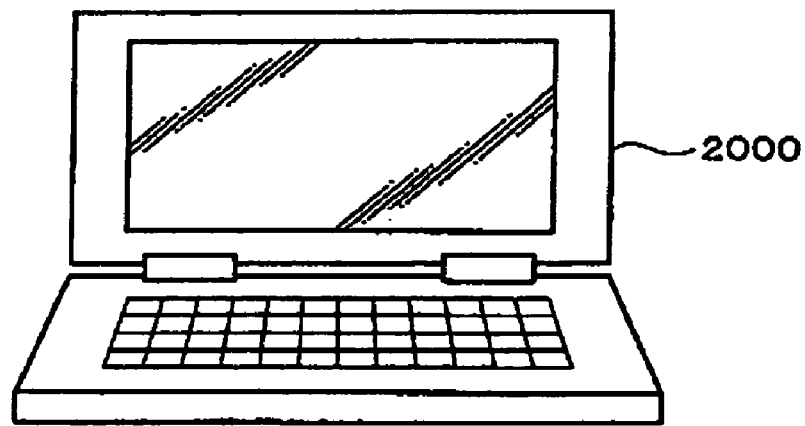
FIG. 29 is a view showing electronic equipment including a semiconductor device according to an embodiment to which the present invention is applied.
Figure 30:
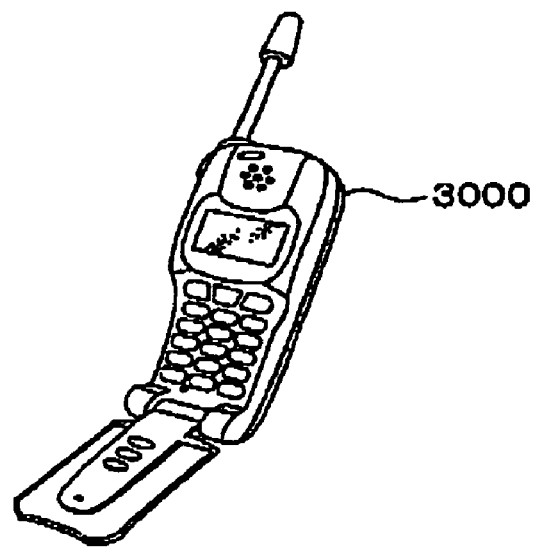
FIG. 30 is a view showing another piece of electronic equipment including a semiconductor device according to an embodiment to which the present invention is applied.

FIG. 28 shows a circuit board 1000 on which a semiconductor device 1 described in any of the above embodiments is mounted. FIGS. 29 and 30 respectively show a notebook-type personal computer 2000 and a portable telephone 3000 as examples of electronic equipment including the semiconductor device.

The present invention is not limited to the above-described embodiments. Various modifications and variations are possible. For example, the present invention includes configurations essentially the same as the configurations described in the embodiments (for example, configurations having the same function, method, and results, or configurations having the same object and results). The present invention includes configurations in which any unessential part of the configuration described in the embodiments is replaced. The present invention includes configurations having the same effects or achieving the same object as the configurations described in the embodiments. The present invention includes configurations in which conventional technology is added to the configurations described in the embodiments.

What is claimed is:

1. A method of manufacturing a semiconductor device comprising:
forming a first conductive layer over a semiconductor wafer on which a plurality of integrated circuits are formed so that the first conductive layer is electrically connected with electrodes of the semiconductor wafer;
forming one or more posts on the first conductive layer by discharging drops of a solvent containing fine particles of a conductive material;
forming an insulating layer so that at least a part of the insulating layer is disposed on the first conductive layer;
forming a second conductive layer so that at least a part of the second conductive layer is disposed on the insulating layer over the first conductive layer; and
cutting the semiconductor wafer,
wherein each of the first and second conductive layers is formed by discharging drops of a solvent containing fine particles of a conductive material,
wherein the insulating layer is formed by discharging drops of a solvent containing fine particles of an insulating material, and
wherein the insulating layer is formed to avoid a region in which the posts are formed.

2. The method of manufacturing a semiconductor device as defined in claim 1,
wherein the second conductive layer is formed so that a part of the second conductive layer is electrically connected with a part of the first conductive layer.

3. The method of manufacturing a semiconductor device as defined in claim 1,
wherein the insulating layer is formed on the first conductive layer and in a region adjacent to the first conductive layer.

4. The method of manufacturing a semiconductor device as defined in claim 3, wherein
the insulating layer is formed of a plurality of layers,
a lower layer of the insulating layer is formed in a region adjacent to a region in which the first conductive layer is formed, and
an upper layer of the insulating layer is formed on the first conductive layer and the lower layer of the insulating layer.

5. The method of manufacturing a semiconductor device as defined in claim 4,
wherein the lower layer of the insulating layer is formed after forming the first conductive layer.

6. The method of manufacturing a semiconductor device as defined in claim 4,
wherein the first conductive layer is formed after forming the lower layer of the insulating layer.

7. The method of manufacturing a semiconductor device as defined in claim 1,
wherein the insulating layer is formed so that a height of an upper surface of the insulating layer is substantially equal to a height of an upper surface of at least one of the posts.

8. The method of manufacturing a semiconductor device as defined in claim 1,
wherein the second conductive layer is formed to pass over at least one of the posts.

9. The method of manufacturing a semiconductor device as defined in claim 1,
wherein the second conductive layer is formed to avoid at least one of the posts.

10. The method of manufacturing a semiconductor device as defined in claim 9, further comprising:
forming a second insulating layer so that at least a part of the second insulating layer is disposed on the second conductive layer; and
forming a third conductive layer so that at least a part of the third conductive layer is disposed on the second insulating layer over the second conductive layer,
wherein the third conductive layer is formed by discharging drops of a solvent containing fine particles of a conductive material, and
wherein the second insulating layer is formed by discharging drops of a solvent containing fine particles of an insulating material.

11. The method of manufacturing a semiconductor device as defined in claim 10, wherein
the second insulating layer is formed to avoid a region in which at least one of the posts is formed, and
the third conductive layer is formed to pass over at least one of the posts.

12. The method of manufacturing a semiconductor device as defined in claim 11,
wherein at least one of the posts is formed by a plurality of steps.

13. The method of manufacturing a semiconductor device as defined in claim 10, further comprising:
forming one or more electronic components,
wherein each of a plurality of components forming one of the electronic components is formed by discharging drops of a solvent containing fine particles of a material.

14. The method of manufacturing a semiconductor device as defined in claim 13, wherein each of the electronic components is one of a capacitor, a resistor, a diode, and a transistor.

15. The method of manufacturing a semiconductor device as defined in claim 13, wherein at least one of the electronic components is formed on a surface on which the first conductive layer is formed.

16. The method of manufacturing a semiconductor device as defined in claim 13, wherein at least one of the electronic components is formed on the insulating layer.

17. The method of manufacturing a semiconductor device as defined in claim 13, wherein at least one of the electronic components is formed on the second insulating layer.

* * * * *